US012155027B2

(12) United States Patent
Kim et al.

(10) Patent No.: US 12,155,027 B2
(45) Date of Patent: Nov. 26, 2024

(54) DISPLAY DEVICE INCLUDING A PAD UNIT CONNECTED TO A PIXEL

(71) Applicant: SAMSUNG DISPLAY CO., LTD., Yongin-si (KR)

(72) Inventors: Jin Yeong Kim, Yongin-si (KR); Mi Jin Park, Yongin-si (KR); Sang Ho Park, Yongin-si (KR); Tae Hoon Yang, Yongin-si (KR); Sung Jin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/544,371

(22) Filed: Dec. 18, 2023

(65) Prior Publication Data

US 2024/0120454 A1 Apr. 11, 2024

Related U.S. Application Data

(63) Continuation of application No. 17/867,627, filed on Jul. 18, 2022, now Pat. No. 11,848,409, which is a
(Continued)

(30) Foreign Application Priority Data

Oct. 15, 2019 (KR) ........................ 10-2019-0127760

(51) Int. Cl.
*H01L 33/62* (2010.01)
*G09G 3/32* (2016.01)
(Continued)

(52) U.S. Cl.
CPC .............. *H01L 33/62* (2013.01); *G09G 3/32* (2013.01); *H01L 25/0753* (2013.01);
(Continued)

(58) Field of Classification Search
CPC ...... G09G 3/3225; G09G 3/32; G09G 3/2003; H01L 25/0753; H01L 25/167;
(Continued)

(56) References Cited

U.S. PATENT DOCUMENTS 8,872,214 B2 10/2014 Negishi et al.
9,112,112 B2 8/2015 Do et al.
(Continued)

FOREIGN PATENT DOCUMENTS

JP 2008-192797 A 8/2008
JP 2014-75550 A 4/2014
(Continued)

*Primary Examiner* — Alonzo Chambliss
(74) *Attorney, Agent, or Firm* — Lewis Roca Rothgerber Christie LLP

(57) ABSTRACT

A display device includes a substrate including a display area and a non-display area, a pixel located in the display area, a pad unit on one side of the non-display area, and a driver connected to the pixel. The pixel includes a first insulating layer, a first light emitting element on the first insulating layer, a second insulating layer on the first light emitting element and exposing one end portion and another end portion of the first light emitting element, a first contact electrode on the second insulating layer and connected to the one end portion of the first light emitting element, and a second contact electrode on the second insulating layer and connected to the other end portion of the first light emitting element. The pad unit includes a pad metal layer, a first pad insulating layer, a second pad insulating layer, and a pad electrode.

17 Claims, 18 Drawing Sheets

Related U.S. Application Data continuation of application No. 16/927,758, filed on Jul. 13, 2020, now Pat. No. 11,393,964.

(51) Int. Cl.
| | |
|---|---|
| *H01L 25/075* | (2006.01) |
| *H01L 25/16* | (2023.01) |
| *H01L 33/20* | (2010.01) |
| *H01L 33/38* | (2010.01) |
| *H10K 59/12* | (2023.01) |
| *H10K 59/122* | (2023.01) |
| *H10K 59/131* | (2023.01) |
| *H10K 59/179* | (2023.01) |
| *G09G 3/20* | (2006.01) |

(52) U.S. Cl.
CPC ............ *H01L 25/167* (2013.01); *H01L 33/20* (2013.01); *H01L 33/38* (2013.01); *H10K 59/12* (2023.02); *H10K 59/122* (2023.02); *H10K 59/131* (2023.02); *H10K 59/179* (2023.02); *G09G 3/2003* (2013.01); *G09G 2300/0426* (2013.01); *G09G 2300/0439* (2013.01)

(58) Field of Classification Search
CPC ......... H01L 33/62; H01L 33/38; H01L 33/20; H10K 59/131; H10K 59/179; H10K 59/122
See application file for complete search history.

(56) References Cited

U.S. PATENT DOCUMENTS

| | | | |
|---|---|---|---|
| 9,397,150 B2 | 7/2016 | Kim et al. | |
| 9,773,761 B2 | 9/2017 | Do | |
| 11,074,858 B2 | 7/2021 | Cho et al. | |
| 11,394,964 B2 | 7/2022 | Henry et al. | |
| 11,848,407 B2 * | 12/2023 | Lee | ........................ H01L 25/167 |
| 11,848,409 B2 * | 12/2023 | Kim | ........................ G09G 3/325 |
| 11,908,845 B2 * | 2/2024 | Woo | ......................... H01L 33/62 |
| 2011/0089850 A1 | 4/2011 | Shibata et al. | |
| 2014/0027726 A1 | 1/2014 | Choi et al. | |
| 2019/0051242 A1 | 2/2019 | Lee et al. | |
| 2019/0148672 A1 | 5/2019 | Seo et al. | |
| 2020/0168662 A1 | 5/2020 | Kim et al. | |

FOREIGN PATENT DOCUMENTS

| | | |
|---|---|---|
| JP | 2014-123583 A | 7/2014 |
| JP | 2015-11784 A | 1/2015 |
| KR | 10-1244926 B1 | 3/2013 |
| KR | 10-1490758 B1 | 2/2015 |
| KR | 10-2015-0075633 A | 7/2015 |
| KR | 10-2019-0006430 A | 1/2019 |
| KR | 10-2019-0096475 A | 8/2019 |
| KR | 10-2020-0085977 A | 7/2020 |
| KR | 10-2020-0088954 A | 7/2020 |
| KR | 10-2020-0105598 A | 9/2020 |
| KR | 10-2020-0118937 A | 10/2020 |

* cited by examiner

DISPLAY DEVICE INCLUDING A PAD UNIT CONNECTED TO A PIXEL

CROSS-REFERENCE TO RELATED APPLICATIONS

This application is a continuation of U.S. patent application Ser. No. 17/867,627, filed Jul. 18, 2022, which is a continuation of U.S. patent application Ser. No. 16/927,758, filed Jul. 13, 2020, now U.S. Pat. No. 11,393,964, which claims priority to and the benefit of Korean Patent Application No. 10-2019-0127760, filed Oct. 15, 2019, the entire content of all of which is incorporated herein by reference.

BACKGROUND

1. Field

The disclosure relates to a display device, and more particularly, to a display device including a light emitting element.

2. Description of the Related Art

A display device may display an image by using a light emitting element such as a light emitting diode (LED) as a light source of a pixel. The light emitting diode exhibits relatively excellent durability even in a poor environmental condition, and exhibits excellent performance in terms of lifetime and luminance.

Manufacturing a light emitting diode by using a material of an inorganic crystal structure having high reliability, and using the light emitting diode as a pixel light source by placing the light emitting diode on a panel of a display device, may be desirable. As part of such effort, development for a display device, which is for manufacturing a light emitting diode of about a micro scale or a nano scale and using the light emitting diode as a light source of each pixel, is being conducted.

SUMMARY

In a process of arranging light emitting elements of a display device, when a defect, such as a short circuit and a disconnection, occurs in some light emitting elements, a problem (or challenge) that the entire pixel including the light emitting element in which the defect occurs does not emit light according to a connection relationship of the light emitting elements, may occur.

The embodiments of the present disclosure provides a display device including light emitting elements connected in series and in parallel with each other.

The features and aspects of the present disclosure are not limited to the above-described features and aspects, and other technical problems which are not described will be clearly understood by those skilled in the art from the following description.

A display device according to some embodiments of the present disclosure includes a substrate including a display area and a non-display area, a pixel located in the display area, a pad unit located on one side of the non-display area, and a driver connected to the pixel through the pad unit. The pixel includes a first insulating layer, a first light emitting element on the first insulating layer, a second insulating layer on the first light emitting element and exposing one end portion and another end portion of the first light emitting element, a first contact electrode on the second insulating layer and connected to the one end portion of the first light emitting element, and a second contact electrode on the second insulating layer and connected to the other end portion of the first light emitting element. The pad unit includes a pad metal layer, a first pad insulating layer on the pad metal layer and including a pad opening portion exposing at least a portion of the pad metal layer, a second pad insulating layer on the first pad insulating layer, and a pad electrode on the first pad insulating layer and being in contact with the pad metal layer through the pad opening portion. The second pad insulating layer does not overlap the pad metal layer.

The pixel may include a second light emitting element, a third light emitting element, and a fourth light emitting element located on the first insulating layer, and a third contact electrode, a fourth contact electrode, and a fifth contact electrode located on the second insulating layer, the second contact electrode may be connected to one end portion of the second light emitting element, the third contact electrode may be connected to another end portion of the second light emitting element and one end portion of the third light emitting element, the fourth contact electrode may be connected to another end portion of the third light emitting element and one end portion of the fourth light emitting element, and the fifth contact electrode may be connected to another end portion of the fourth light emitting element.

The first contact electrode may be connected to the fifth contact electrode, the second contact electrode may be connected to the fourth contact electrode, and the third contact electrode may be separated from the first contact electrode, the second contact electrode, the fourth contact electrode, and the fifth contact electrode.

The first light emitting element and the second light emitting element may be connected in series, the third light emitting element and the fourth light emitting element may be connected in series, the first light emitting element and the fourth light emitting element may be connected in parallel, and the second light emitting element and the third light emitting element may be connected in parallel.

The pixel may further include an electrode layer located between the substrate and the first insulating layer, and the electrode layer may include a first electrode overlapping the first contact electrode, a second electrode overlapping the second contact electrode, a third electrode overlapping the third contact electrode, a fourth electrode overlapping the fourth contact electrode, and a fifth electrode overlapping the fifth contact electrode.

The first insulating layer may include a first opening portion exposing at least a portion of the third electrode and a second opening portion exposing at least a portion of the fifth electrode, the third contact electrode may be in contact with the third electrode through the first opening portion, and the fifth contact electrode may be in contact with the fifth electrode through the second opening portion.

The display device may further include a transistor located between the substrate and the pixel and electrically connected to the first light emitting element. The transistor may include a semiconductor pattern on the substrate, a gate electrode on the semiconductor pattern, and a first transistor electrode and a second transistor electrode on the gate electrode, the semiconductor pattern may include a first region being in contact with the first transistor electrode, a second region spaced from the first region and being in contact with the second transistor electrode, and a channel region located between the first region and the second region, the first transistor electrode may be electrically connected to a first power line located on a layer different from a layer on which the first transistor electrode is located, and the second transistor electrode may be electrically connected to the third contact electrode.

The fifth contact electrode may be electrically connected to a second power line, the second power line may be at the same layer as the first power line, and a voltage applied to the first power line may be greater than a voltage applied to the second power line.

The fourth contact electrode may be electrically connected to a third power line, the third power line may be located at the same layer as the first power line and the second power line, and a voltage applied to the third power line may be a voltage between the voltage applied to the first power line and the voltage applied to the second power line.

The pad metal layer may include at least one of a first metal layer, a second metal layer on the first metal layer, and a third metal layer on the second metal layer, the first metal layer may be located at the same layer as the first transistor electrode and the second transistor electrode, the second metal layer may be located at the same layer as the first power line and the second power line, and the third metal layer may be located at the same layer as the electrode layer.

The first contact electrode, the third contact electrode, and the fifth contact electrode may be located at the same layer, and the second contact electrode and the fourth contact electrode may be located at the same layer.

The first pad insulating layer and the first insulating layer may be integrally formed (or placed), and the second pad insulating layer and the second insulating layer may be integrally formed.

The first light emitting element may be a light emitting diode having a size of a nano scale, and the first light emitting element may include a first semiconductor layer in which a first dopant is doped, a second semiconductor layer in which a second dopant is doped, and an active layer between the first semiconductor layer and the second semiconductor layer.

The pixel may further include a third insulating layer on the first contact electrode, the pad unit may further include a third pad insulating layer on the pad metal layer and the second pad insulating layer, the second contact electrode may be on the third insulating layer, the third pad insulating layer may include the pad opening portion exposing at least a portion of the pad metal layer, and the third insulating layer may be formed integrally with the third pad insulating layer.

At least a portion of the pad electrode may overlap the first pad insulating layer and the third pad insulating layer, and the pad electrode may not overlap the second pad insulating layer.

The pad electrode may be located at the same layer as any one of the first contact electrode and the second contact electrode.

A display device according to another embodiment for resolving the above-described object includes a substrate including a display area and a non-display area, a first light emitting element, a second light emitting element, a third light emitting element, and a fourth light emitting element located in the display area, a first electrode connected to one end portion of the first light emitting element, a second electrode connected to another end portion of the first light emitting element and one end portion of the second light emitting element, a third electrode connected to another end portion of the second light emitting element and one end portion of the third light emitting element, a fourth electrode connected to another end portion of the third light emitting element and one end portion of the fourth light emitting element, and a fifth electrode connected to another end portion of the fourth light emitting element, the first electrode may be connected to the fifth electrode, the second electrode may be connected to the fourth electrode, and the third electrode may be separated from the first electrode, the second electrode, the fourth electrode, and the fifth electrode.

The first light emitting element and the second light emitting element may be connected in series, the third light emitting element and the fourth light emitting element may be connected in series, the first light emitting element and the fourth light emitting element may be connected in parallel, and the second light emitting element and the third light emitting element may be connected in parallel.

The display device may further include a driver located in the non-display area and a pad unit electrically connected to the driver, the pad unit may include a pad metal layer, a first pad insulating layer located on the pad metal layer, and a second pad insulating layer located on the first pad insulating layer, and the second pad insulating layer may not overlap the pad metal layer.

The display device may further include a first insulating layer between the substrate and the first to fourth light emitting elements, and a second insulating layer located on each of the first to fourth light emitting elements, the first pad insulating layer may be formed integrally with the first insulating layer, and the second pad insulating layer may be formed integrally with the second insulating layer.

Specific details of other embodiments are included in the detailed description and drawings.

The display device according to the embodiments of the present disclosure may include the light emitting elements connected in series and in parallel with each other. Therefore, the embodiments of the display device may be robust to a defect of a pixel during a short circuit and/or disconnection of some light emitting elements.

The features and aspects according to the embodiments are not limited by the details illustrated above. More features and aspects may be included in various embodiments of the present disclosure.

BRIEF DESCRIPTION OF THE DRAWINGS

The above and other features and aspects of the present disclosure will become more apparent by describing in further detail embodiments thereof with reference to the accompanying drawings, in which.

DETAILED DESCRIPTION

Figure 1A:
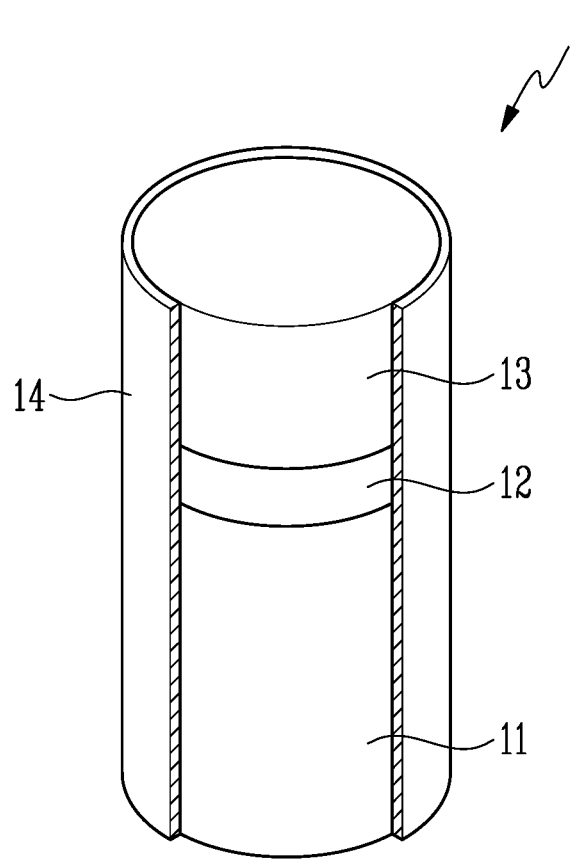
FIGS. 1A and 1B are perspective views of a light emitting element, according to some embodiments of the present disclosure.

The features and aspects of the present disclosure and a method of achieving them will become apparent with reference to the embodiments described in detail below together with the accompanying drawings. However, the disclosure is not limited to the embodiments disclosed below, and may be implemented in various different forms as those of ordinary skill in the art would appreciate. The present embodiments are provided so that the disclosure will be thorough and complete and those skilled in the art to which the disclosure pertains can fully understand the scope of the disclosure. The scope of the present disclosure is defined by the claims and their equivalents.

A case where an element or a layer is referred to as "on" another element or layer includes a case where another layer or another element is located directly on the other element or between the other layers. The same reference numerals denote to the same components throughout the specification.

Although a first, a second, and the like are used to describe various components, it goes without saying that these components are not limited by these terms. These terms are used only to distinguish one component from another component. Therefore, it goes without saying that a first component mentioned below may be a second component within the technical spirit of the disclosure. The singular expressions include plural expressions unless the context clearly dictates otherwise.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the disclosure refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a display apparatus and method of driving the same have been specifically described and illustrated herein, many modifications and variations will be apparent to those skilled in the art. Accordingly, it is to be understood that a display apparatus and method of driving the same constructed according to principles of this invention may be embodied other than as specifically described herein. The invention is also defined in the following claims, and equivalents thereof.

Hereinafter, embodiments of the disclosure will be described in detail with reference to the accompanying drawings. The same or similar reference numerals are used for the same components in the drawings.

Figure 1B:
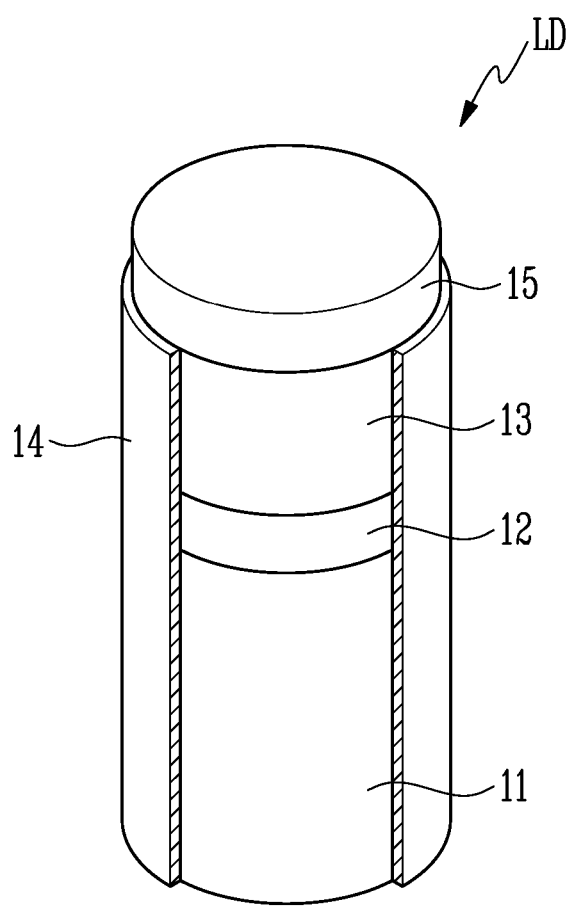

FIGS. 1A and 1B are perspective views of a light emitting element, according to some embodiments of the present disclosure.

Referring to FIGS. 1A and 1B, the light emitting element LD according to some embodiments of the disclosure may include a first semiconductor layer 11, a second semiconductor layer 13, and an active layer 12 interposed between the first and second semiconductor layers 11 and 13. For example, the light emitting element LD may be implemented as a stack (e.g., stack structure) in which the first semiconductor layer 11, the active layer 12, and the second semiconductor layer 13 are sequentially stacked.

According to an embodiment of the disclosure, the light emitting element LD may have a rod shape that extends in one direction. In other words, the light emitting element may have a rod shaped structure or a bar shaped structure. When an extension direction of the light emitting element LD is a length direction, the light emitting element LD may have one end portion and another end portion along the length direction.

In an embodiment of the disclosure, one of the first and second semiconductor layers 11 and 13 may be located at the one end portion and the other one of the first and second semiconductor layers 11 and 13 may be located at the other end portion.

In an embodiment of the disclosure, the light emitting element LD may have a rod shape. Here, the term "rod" may include a rod-like shape or a bar-like shape that is extended in the length direction (that is, having an aspect ratio greater than 1), such as a cylinder, a polygonal column, or the like. For example, a length of the light emitting element LD may be larger than a diameter thereof. However, the disclosure is not limited thereto. For example, the light emitting element LD may be a light emitting element of a core-shell structure.

For example, the light emitting element LD may be manufactured to have a diameter and/or a length of about a micro scale or a nano scale. For example, the diameter of the light emitting element LD may be equal to or less than 600 nm, and the length of the light emitting element LD may be equal to or less than 4 μm, but a size of the light emitting element LD is not limited thereto, and the size of the light emitting element LD may be changed according to requirements or characteristics of the display device to which the light emitting element LD is applied.

For example, the first semiconductor layer 11 may include at least one n-type semiconductor layer. For example, the first semiconductor layer 11 may include a semiconductor material of any one of InAlGaN, GaN, AlGaN, InGaN, AlN, and InN, and may include a semiconductor layer in which a first dopant such as Si, Ge, Sn, or the like is doped. The material configuring the first semiconductor layer 11 is not limited thereto, and the first semiconductor layer 11 may be configured of various suitable materials known to those of ordinary skill in the art.

The active layer 12 may be on the first semiconductor layer 11 and may be a single or multi-quantum well structure. When the active layer 12 includes a material of the multi-quantum well structure, the active layer 12 may be a structure in which a quantum layer and a well layer are stacked alternately with each other.

When an electric field (e.g., an electric field of a predetermined voltage or more) is applied to both end portions of the light emitting element LD, the light emitting element LD emits light while an electron-hole pair is coupled in the active layer 12. By controlling the light emission of the light emitting element LD by using such a principle, the light emitting element LD may be used as a light source of various light emitting devices including a pixel of the display device.

The active layer 12 may emit light having a wavelength of 400 nm to 900 nm. For example, when the active layer 12 emits light of a blue wavelength band, the active layer 12 may include a material such as AlGaN or AlGaInN. For example, when the active layer 12 is the structure in which the quantum layer and the well layer are alternately stacked in the multi-quantum well structure, the quantum layer may include a material such as AlGaN or AlGaInN, and the well layer may include GaN or AlInN. In an embodiment, the active layer 12 may include AlGaInN as the quantum layer and AlInN as the well layer, and as described above, the active layer 12 may emit blue light having a central wavelength band of a range of 450 nm to 495 nm.

However, the disclosure is not limited thereto, and the active layer 12 may be a structure in which one or more semiconductor materials having a large band gap energy and one or more semiconductor materials having a small band gap energy are alternately stacked with each other, or may include one or more III-V group semiconductor materials according to a wavelength band of emitted light. The light emitted by the active layer 12 is not limited to the light of the blue wavelength band, and in some cases, the active layer 12 may emit light of red and green wavelength bands.

Meanwhile, the light emitted from the active layer 12 may be emitted from both sides (e.g., both end portions) as well as an outer surface that extends in a length direction of the light emitting element LD. Directivity of the light emitted from the active layer 12 is not limited to any particular direction.

The second semiconductor layer 13 may be on the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material from among InAlGaN, GaN, AlGaN, InGaN, AlN, and InN, and may include a semiconductor layer in which a second dopant such as Mg, Zn, Ca, Se, or Ba, is doped. The material configuring the second semiconductor layer 13 is not limited thereto, and various suitable materials other than the materials described above may configure the second semiconductor layer 13, as those of ordinary skill in the art would appreciate.

Meanwhile, in the drawing, the first semiconductor layer 11 and the second semiconductor layer 13 are configured as one layer, but the present disclosure is not limited thereto. For example, the first semiconductor layer 11 and the second semiconductor layer 13 may include a greater number of layers according to the material of the active layer 12. For example, in some embodiments, the first semiconductor layer 11 and the second semiconductor layer 13 may further include a clad layer or a tensile strain barrier reducing (TSBR) layer.

According to an embodiment of the disclosure, the light emitting element LD may further include different fluorescent layers, active layers, semiconductor layers, and/or electrode layers on and/or under each layer, in addition to the above-described first semiconductor layer 11, active layer 12, and second semiconductor layer 13.

In some embodiments, the light emitting element LD may further include at least one electrode layer located at (or on) one end (for example, upper surface) side of the second semiconductor layer 13 or one end (for example, lower surface) side of the first semiconductor layer 11. For example, the light emitting element LD may further include an electrode layer 15 located at (or on) one end side of the second semiconductor layer 13 as shown in FIG. 1B. The electrode layer 15 may be an ohmic electrode, but is not limited thereto. For example, the electrode layer 15 may be a Schottky contact electrode. The electrode layer 15 may include a metal or a metal oxide. For example, chromium (Cr), titanium (Ti), aluminum (Al), gold (Au), nickel (Ni), indium tin oxide (ITO), Indium Zinc Oxide (IZO), Indium Tin-Zinc Oxide (ITZO), and an oxide or an alloy thereof may be used alone or in combination, but the present disclosure not limited thereto. In addition, according to an embodiment, the electrode layer 15 may be substantially transparent or translucent. Therefore, light generated in the light emitting element LD may pass through the electrode layer 15 and may be emitted to the outside of the light emitting element LD.

In addition, the light emitting element LD may further include an insulating film 14. However, according to an embodiment of the disclosure, the insulating film 14 may be omitted and/or may be provided so as to cover only a portion of the first semiconductor layer 11, the active layer 12, and the second semiconductor layer 13. For example, the insulating film 14 may be provided at a portion other than both end portions of the light emitting element LD, and thus the both end portions of the light emitting element LD may be exposed.

For convenience of description, FIGS. 1A and 1B show a state in which a portion of the insulating film 14 is deleted or omitted from a portion of the sides of the light emitting element LD. According to embodiments, however, all sides of the light emitting element LD (e.g., the sides of 11, 12, and 13) may actually be surrounded by the insulating film 14.

According to an embodiment of the present disclosure, the insulating film 14 may include a transparent insulating material. For example, the insulating film 14 may include at least one insulating material from among SiO2, Si3N4, $Al_2O_3$, and TiO2, but is not limited thereto. Various suitable materials having insulating properties may be used.

The insulating film 14 may prevent an electrical short circuit (or reduce the chances of an occurrence of an unwanted electrical short circuit) that may occur when the active layer 12 is in contact (e.g., direct contact) with a conductive material other than the first semiconductor layer 11 and the second semiconductor layer 13. In addition, by forming the insulating film 14, a surface defect of the light emitting element LD may be minimized or reduced, thereby improving lifetime and efficiency of the light emitting element LD. In addition, when a plurality of light emitting elements LD are closely located, the insulating film 14 may prevent an unwanted short circuit (or reduce the chances of an occurrence of an unwanted electrical short circuit) that may occur between the neighboring light emitting elements LD.

A type, a structure, a shape, and the like of the light emitting element LD according to the embodiments of the disclosure may be variously changed in any suitable manner as those skilled in the art would appreciate.

Figure 2:
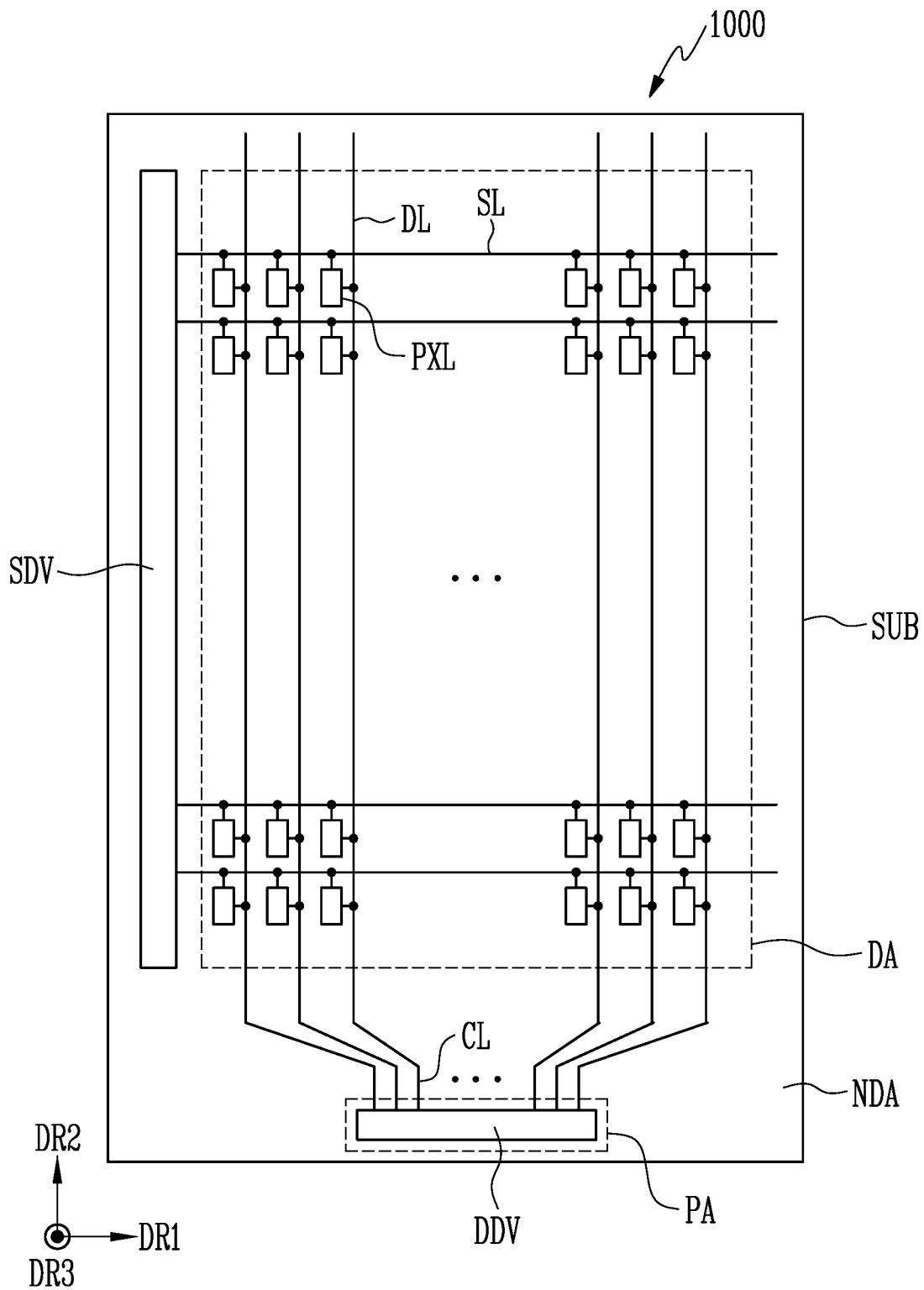
FIG. 2 is a plan view illustrating a display device, according to some embodiments of the present disclosure.

FIG. 2 is a plan view illustrating the display device, according to some embodiments of the present disclosure.

Referring to FIGS. 1A-2, the display device 1000 may include a substrate SUB and a plurality of pixels PXL on the substrate SUB. By way of example, the display device 1000 (or the substrate SUB) may include a display area DA in which an image is displayed and a non-display area NDA except for the display area DA.

The display area DA may be an area where the pixels PXL are located. The non-display area NDA may be an area where the drivers, e.g., a scan driver (SDV) and a data driver or a display driver (DDV), for driving the pixels PXL, and various lines, e.g., data lines (DL), scan lines (SL), and control lines (CL), connecting the pixels PXL and the drivers to each other are located.

The display area DA may have various suitable shapes. For example, the display area DA may be provided in various shapes, such as, a polygon of a closed shape including a side formed of a straight line, a circle, an ellipse, or the like including a side formed of a curved line, and a semi-circle or a semi-ellipse including a side formed of a straight line and a curved line.

When the display area DA includes a plurality of areas, each area may also be provided in various shapes, such as, a polygon of a closed shape including a side formed of a straight line, and a circle, an ellipse, or the like including a side formed of a curved line. In addition, the areas of the plurality of areas may be the same or different from each other. In an embodiment of the present disclosure, a case where the display area DA is defined as one area having a quadrangle shape with sides of a straight line will be described as an example.

The non-display area NDA may be provided at (or on) at least one side of the display area DA. In an embodiment of the present disclosure, the non-display area NDA may surround the display area DA.

The pixels PXL may be located in the display area DA on the substrate SUB. Each of the pixels PXL may include at least one light emitting element LD connected to a scan line SL and a data line DL and driven by a corresponding scan signal and a corresponding data signal.

Each of the pixels PXL may emit one of red, green, and blue light, but is not limited thereto. For example, each of the pixels PXL may emit one of cyan, magenta, yellow, and white light.

The pixels PXL may include a first pixel that emits light of a first color, a second pixel that emits light of a second color different from the first color, and a third pixel that emits light of a third color different from the first color and the second color. The at least one of the first pixel, the second pixel, and the third pixel that are adjacent to each other may configure one pixel unit capable of emitting light of various colors.

According to an embodiment, the first pixel may be a red pixel for emitting red light, the second pixel may be a green pixel for emitting green light, and the third pixel may be a blue pixel for emitting blue light.

In an embodiment, each of the pixels PXL may include light emitting elements that emit light of the same color, and may include light conversion layers of different colors located on each of the light emitting elements to emit light of different colors. In another embodiment, each of the pixels PXL may include light emitting elements that emit light of different colors. However, the color, type, number, and/or the like of the pixels PXL are/is not particularly limited.

A plurality of pixels PXL may be provided and arranged along a first direction DR1 and a second direction DR2 crossing the first direction DR1. An arrangement form (or layout) of the pixels PXL may not be particularly limited and the pixels PXL may be arranged in suitable various forms as those of ordinary skill in the art would appreciate.

The drivers SDV and DDV may be located in the non-display area NDA. The drivers SDV and DDV may provide a signal to each of the pixels PXL through the lines SL and DL, thereby controlling driving of each of the pixels PXL. The drivers SDV and DDV may include a scan driver SDV that provides a scan signal to the pixels PXL through the scan lines SL, a data driver DDV that provides a data signal to the pixels PXL through the data lines DL, and a timing controller (not shown). The timing controller may control the scan driver SDV and the data driver DDV. According to an embodiment, the display device 1000 may further include a light emission driver that provides a light emission control signal to the pixels PXL through a light emission control line.

The scan driver SDV may be located on one side of the substrate SUB and may be located along one direction (for example, the second direction DR2). The scan driver SDV may be mounted on the substrate SUB as a separate component, but is not limited thereto. For example, the scan driver SDV may be directly on the substrate SUB. In addition, the scan driver SDV may be positioned outside the substrate SUB and connected to each of the pixels PXL through a separate connection member.

The data driver DDV may be connected to each of the pixels PXL through a pad unit PA, and may provide the data signal to the pixels PXL. The pad unit PA may be located in the non-display area NDA, and may include a plurality of pads (not shown) to be connected to the data driver DDV. The data lines DL for supplying the data signal to each of the pixels PXL may be connected to the data driver DDV through connection lines CL. The data driver DDV may be located directly on the pad unit PA or may be connected to the pad unit PA through a separate connection member. The pad unit PA will be described later in detail with reference to FIG. 9.

In an embodiment, each of the pixels PXL may be configured as an active pixel. However, a type, a structure, and/or a driving method of the pixels PXL applicable to the disclosure are/is not particularly limited.

Figure 3A:
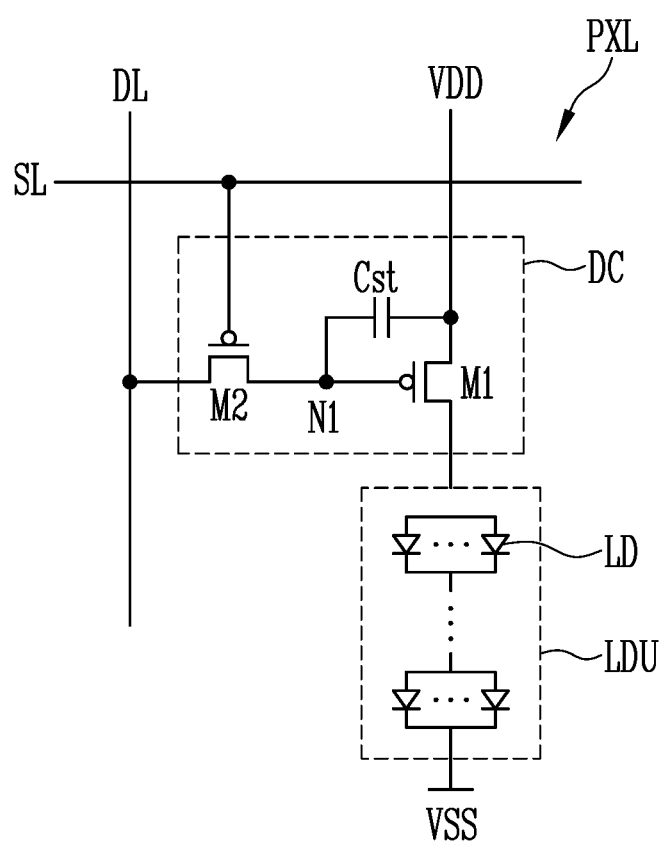
FIGS. 3A-3C are circuit diagrams illustrating a pixel, according to some embodiments of the present disclosure.
Figure 3B:
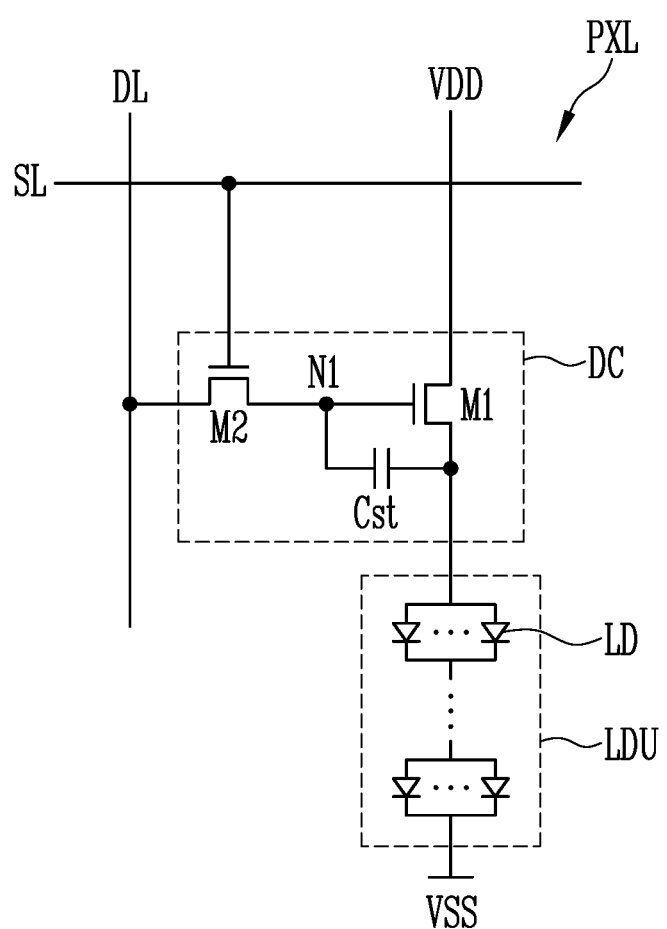
Figure 3C:
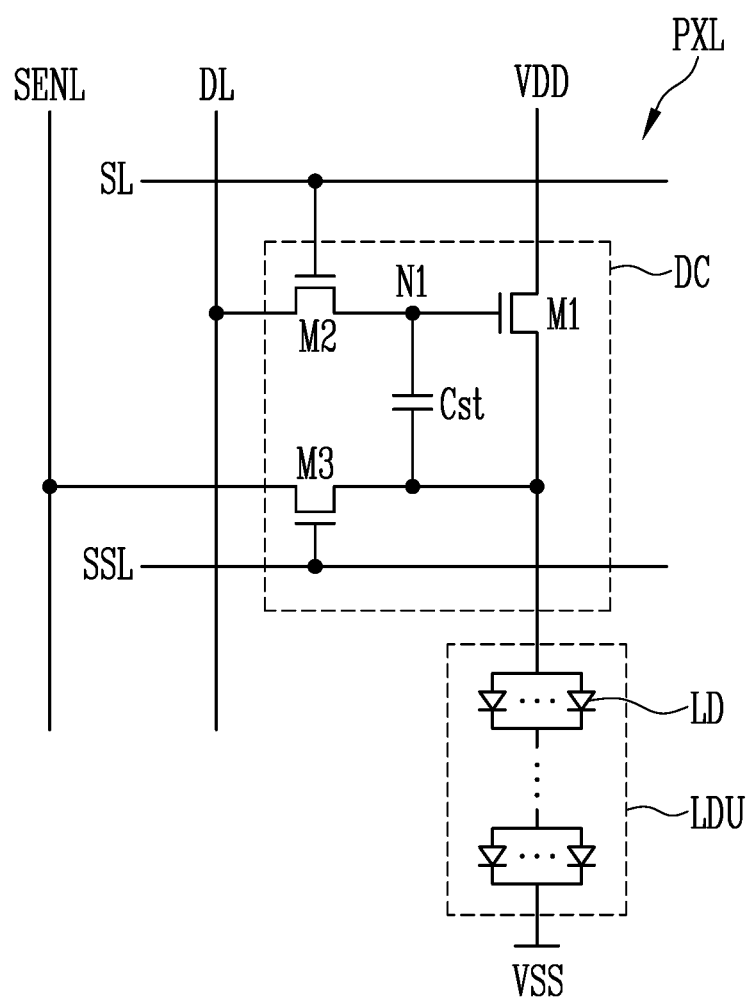

FIGS. 3A-3C are circuit diagrams illustrating the pixel according to an embodiment, respectively. In particular, FIGS. 3A-3C show an example of a pixel from among the pixels PXL configuring an active light emitting display panel (e.g., 1000).

Referring to FIG. 3A, the pixel PXL may include a light emitting element unit LDU including at least one light emitting element LD, and a pixel driving circuit DC connected to the light emitting element unit LDU to drive the light emitting element LD. The light emitting element unit LDU may include a plurality of light emitting elements LD connected in parallel and/or in series with each other.

A first electrode (for example, an anode electrode) of the light emitting element LD may be connected to a first driving power VDD through the pixel driving circuit DC, and a second electrode (for example, a cathode electrode) of the light emitting element LD may be connected to a second driving power VSS.

The first driving power VDD and the second driving power VSS may have different potentials. For example, the second driving power VSS may have a potential equal to or lower than a potential of the first driving power VDD by a threshold voltage or more of the light emitting element LD. That is, a voltage applied to the first driving power VDD may be greater than a voltage applied to the second driving power VSS.

The light emitting element LD may emit light at a luminance corresponding to a driving current controlled by the pixel driving circuit DC.

According to an embodiment of the disclosure, the pixel driving circuit DC may include a first transistor M1, a second transistor M2, and a storage capacitor Cst.

A first electrode of the first transistor M1 (a driving transistor) may be connected to the first driving power VDD, and a second electrode of the first transistor M1 may be electrically connected to the first electrode (for example, the anode electrode) of the light emitting element LD. A gate electrode of the first transistor M1 may be connected to a first node N1. The first transistor M1 may control an amount of driving current supplied to the light emitting elements LD in correspondence with a voltage of the first node N1.

A first electrode of the second transistor M2 (switching transistor) may be connected to the data line DL, and a second electrode of the second transistor M2 may be connected to the first node N1. Here, the first electrode and the second electrode of the second transistor M2 may be different electrodes, and for example, when the first electrode of the second transistor M2 is a source electrode, the second electrode of the second transistor M2 may be a drain electrode. A gate electrode of the second transistor M2 may be connected to the scan line SL.

The second transistor M2 may be turned on when a scan signal of a voltage (for example, a gate on voltage) at which the first transistor M1 may be turned on is supplied from the scan line SL, to electrically connect the data line DL and the first node N1 to each other. At this time, a data signal of a corresponding frame may be supplied to the data line DL, and thus the data signal may be transferred to the first node N1. The data signal transferred to the first node N1 may be stored in the storage capacitor Cst.

One electrode of the storage capacitor Cst may be connected to the first driving power VDD, and another electrode of the storage capacitor Cst may be connected to the first node N1. The storage capacitor Cst may be charged with a voltage corresponding to the data signal supplied to the first node N1, and may maintain the charged voltage until the data signal of a next frame is supplied.

For convenience of description, FIG. 3A shows the driving circuit DC of a relatively simple structure, which includes the second transistor M2 for transferring the data signal into each of the pixel PXLs, the storage capacitor Cst for storing the data signal, and the first transistor M1 for supplying the driving current, corresponding to the data signal, to the light emitting element LD.

However, the disclosure is not limited thereto, and the structure of the driving circuit DC may be variously modified in any suitable manner as those of ordinary skill in the art would appreciate. For example, the driving circuit DC may further include other circuit elements, such as, various transistors, such as, a compensation transistor for compensating for a threshold voltage of the first transistor M1, an initialization transistor for initializing the first node N1, and/or a light emission control transistor for controlling a light emission time of the light emitting element LD, and a boosting capacitor for boosting the voltage of the first node N1.

In addition, in FIG. 3A, all of the transistors included in the driving circuit DC, for example, the first and second transistors M1 and M2 are P-type transistors, but the present disclosure is not limited thereto. That is, at least one of the first and second transistors M1 and M2 included in the driving circuit DC may be an N-type transistor.

For example, referring to FIG. 3B, the first and second transistors M1 and M2 of the driving circuit DC may be implemented as N-type transistors. A driving circuit DC shown in FIG. 3B may have a similar configuration or operation (or operating principle) to that of the driving circuit DC of FIG. 3A except for a connection position change of some components due to a transistor type change (e.g., Cst is connected between node N1 and the second electrode of the first transistor M1). Therefore, redundant description thereof may not be provided again.

In addition, as another example, referring to FIG. 3C, the pixel PXL may further include a third transistor M3 (sensing transistor).

A gate electrode of the third transistor M3 may be connected to a sensing signal line SSL. One electrode of the third transistor M3 may be connected to a sensing line SENL, and another electrode of the third transistor M3 may be connected to the anode electrode of the light emitting element LD. The third transistor M3 may transfer a voltage value at the anode electrode of the light emitting element LD, to the sensing line SENL, according to the sensing signal supplied to the sensing signal line SSL during a sensing period. The voltage value transferred through the sensing line SENL may be provided to an external circuit (for example, the timing controller), and the external circuit may extract characteristic information (for example, the threshold voltage or the like of the first transistor M1) of the pixel PXL, based on the provided voltage value at the anode electrode of the light emitting element LD. The extracted characteristic information may be used to convert image data such that a characteristic deviation (or a characteristic variation) of the pixel PXL is compensated. For example, the characteristic deviation may be used to provide pixel compensation with respect to image data.

Figure 4:
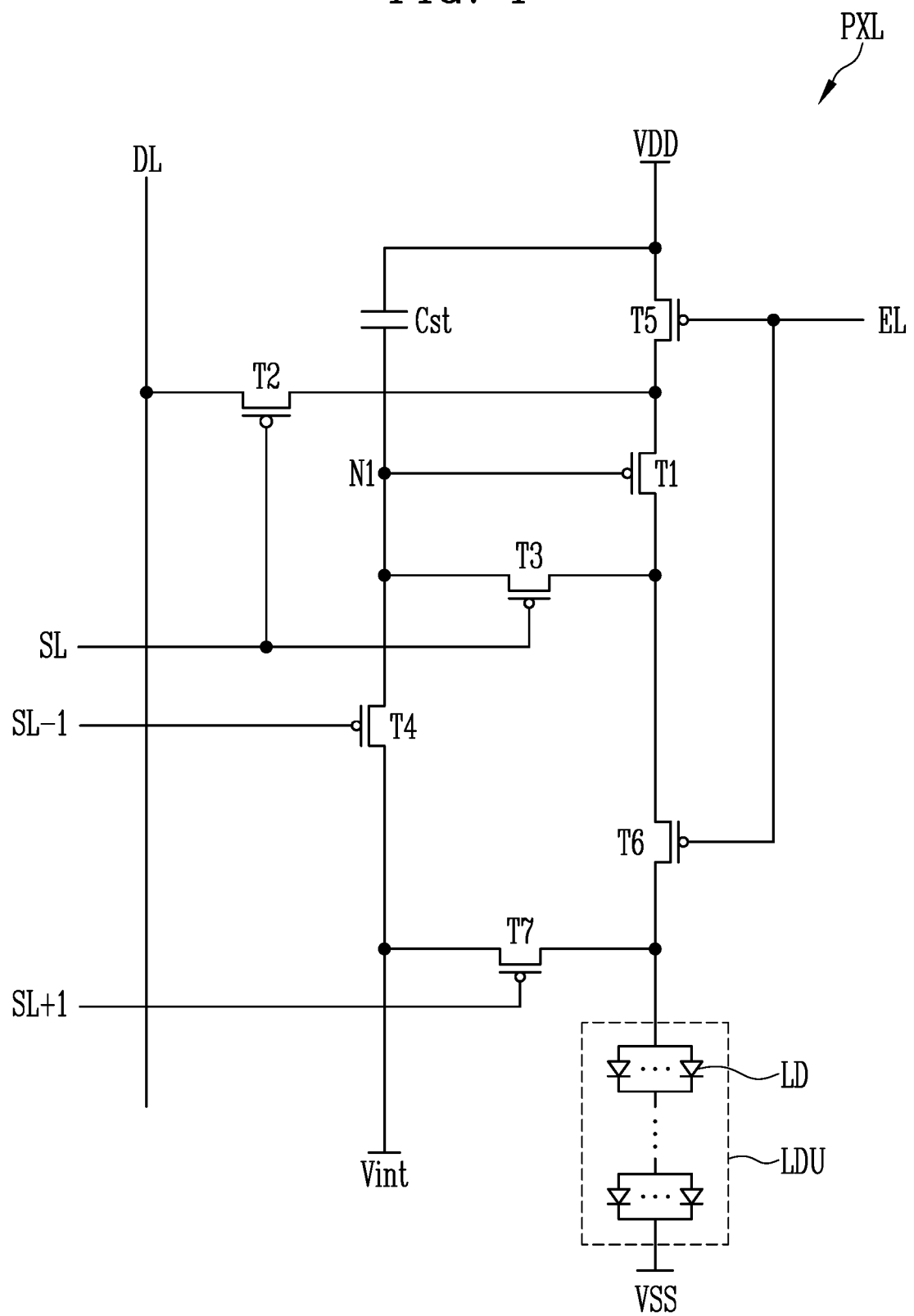
FIG. 4 is a circuit diagram illustrating the pixel, according to some embodiments of the present disclosure.

FIG. 4 is a circuit diagram illustrating the pixel, according to some embodiments of the present disclosure.

Referring to FIG. 4, the pixel PXL according to another embodiment of the present disclosure may include a light emitting element unit LDU, first to seventh transistors T1, T2, T3, T4, T5, T6, and T7, and a storage capacitor Cst.

The light emitting element unit LDU may include a plurality of light emitting elements LD connected in parallel and/or in series with each other. A first electrode (for example, an anode electrode) of the light emitting element LD may be connected to the first transistor T1 through the sixth transistor T6, and a second electrode (for example, a cathode electrode) of the light emitting element LD may be connected to the second driving power VSS. The light emitting element LD may emit light (e.g., may emit light at a set or predetermined luminance) corresponding to an amount of current supplied from the first transistor T1.

One electrode of the first transistor T1 (driving transistor) may be connected to the first driving power VDD through the fifth transistor T5, and another electrode of the first transistor T1 may be connected to the first electrode of the light emitting element LD through the sixth transistor T6. The first transistor T1 may control an amount of current flowing from the first driving power VDD to the second driving power VSS through the light emitting element LD, in correspondence with a voltage of the first node N1 that is a gate electrode thereof.

The second transistor T2 (switching transistor) may be connected between the data line DL and the one electrode of the first transistor T1. In addition, a gate electrode of the second transistor T2 may be connected to the scan line SL. The second transistor T2 may be turned on when a scan signal of a gate on voltage is supplied to the scan line SL, to electrically connect the data line DL and the one electrode of the first transistor T1 to each other.

The third transistor T3 may be connected between the other electrode of the first transistor T1 and the first node N1. In addition, a gate electrode of the third transistor T3 may be connected to the scan line SL. The third transistor T3 may be turned on when the scan signal of the gate on voltage is supplied to the scan line SL, to electrically connect the other electrode of the first transistor T1 and the first node N1 to each other.

The fourth transistor T4 may be connected between the first node N1 and initialization power Vint. A gate electrode of the fourth transistor T4 may be connected to a previous scan line SL-1. The fourth transistor T4 may be turned on when the scan signal of the gate on voltage is supplied to the previous scan line SL-1, to supply a voltage of the initialization power Vint to the first node N1. Here, the initialization power Vint may be set to a voltage lower than that of the data signal.

The fifth transistor T5 may be connected between the first driving power VDD and the one electrode of the first transistor T1. A gate electrode of the fifth transistor T5 may be connected to the light emission control line EL. The fifth transistor T5 may be turned on when a light emission control signal of a gate on voltage is supplied to the light emission control line EL, and may be turned off in other cases.

The sixth transistor T6 may be connected between the other electrode of the first transistor T1 and the first electrode of the light emitting element LD. A gate electrode of the sixth transistor T6 may be connected to the light emission control line EL. The sixth transistor T6 may be turned on when the light emission control signal of the gate on voltage is supplied to the light emission control line EL, and may be turned off in other cases.

The seventh transistor T7 may be connected between the initialization power Vint and the first electrode (for example, the anode electrode) of the light emitting element LD. In addition, a gate electrode of the seventh transistor T7 may be connected to a subsequent scan line SL+1. The seventh transistor T7 may be turned on when the scan signal of the gate on voltage is supplied to the subsequent scan line SL+1, to supply the voltage of the initialization power Vint to the first electrode of the light emitting element LD.

FIG. 4 shows a case where the gate electrode of the seventh transistor T7 is connected to the subsequent scan line SL+1. However, the technical spirit of the present disclosure is not limited thereto. For example, in another embodiment of the present disclosure, the gate electrode of the seventh transistor T7 may be connected to the scan line SL. In this case, the voltage of the initialization power Vint may be supplied to the anode electrode of the light emitting element LD through the seventh transistor T7 when the scan signal of the gate on voltage is supplied to the scan line SL.

The storage capacitor Cst may be connected between the first driving power VDD and the first node N1. The storage capacitor Cst may store a voltage corresponding to the data signal and the threshold voltage of the first transistor T1.

Meanwhile, in FIG. 4, all of the transistors included in the driving circuit DC, for example, the first to seventh transistors T1, T2, T3, T4, T5, T6, and T7, are P-type transistors, however, embodiments of the present disclosure are not limited thereto. For example, at least one of the first to seventh transistors T1, T2, T3, T4, T5, T6, and T7 may be an N-type transistor.

Figure 5:
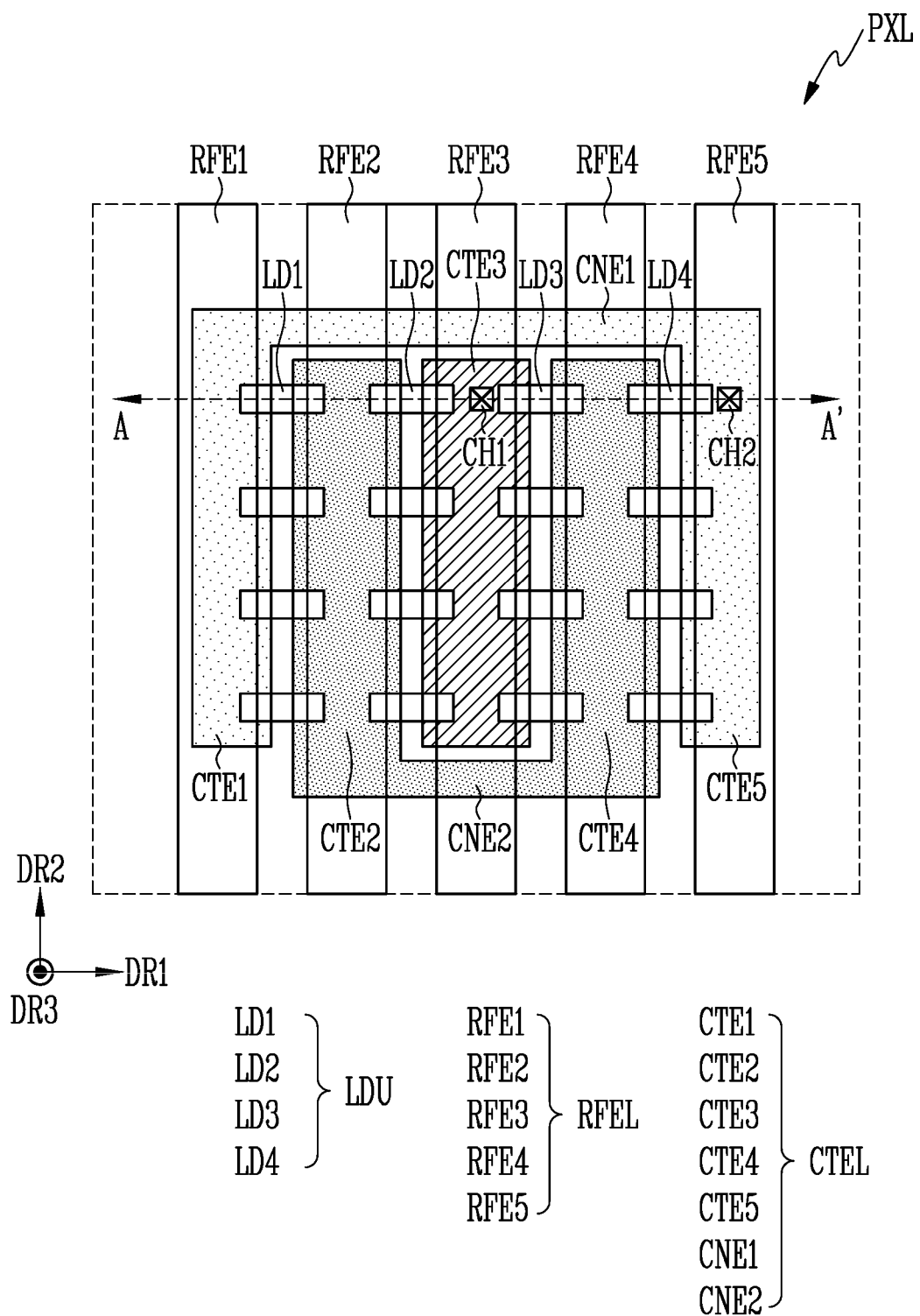
FIG. 5 is a plan view of the pixel, according to some embodiments of the present disclosure.
Figure 6:
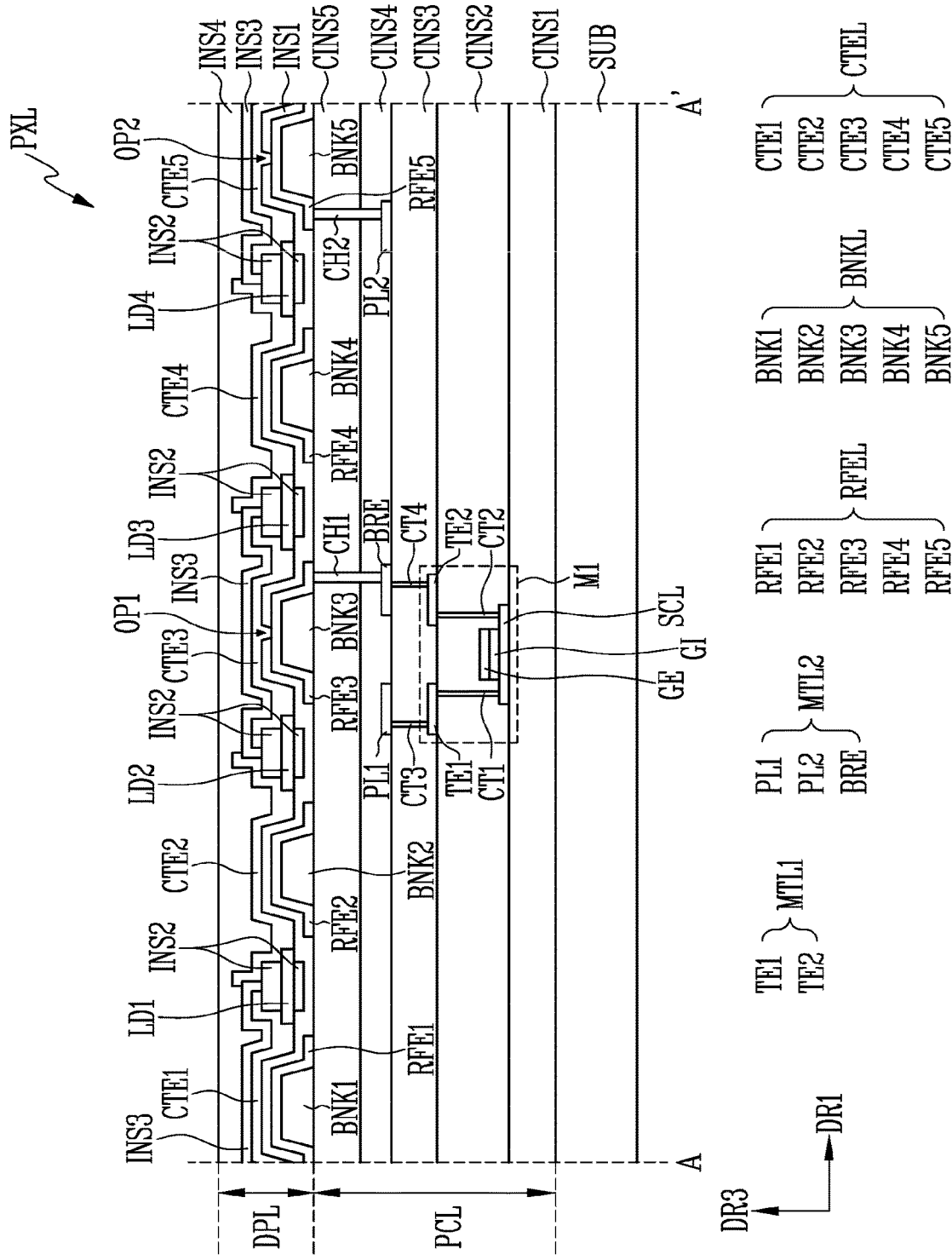
FIG. 6 is a cross-sectional view of the pixel taken along the line A-A' of FIG. 5, according to some embodiments of the present disclosure.
Figure 7A:
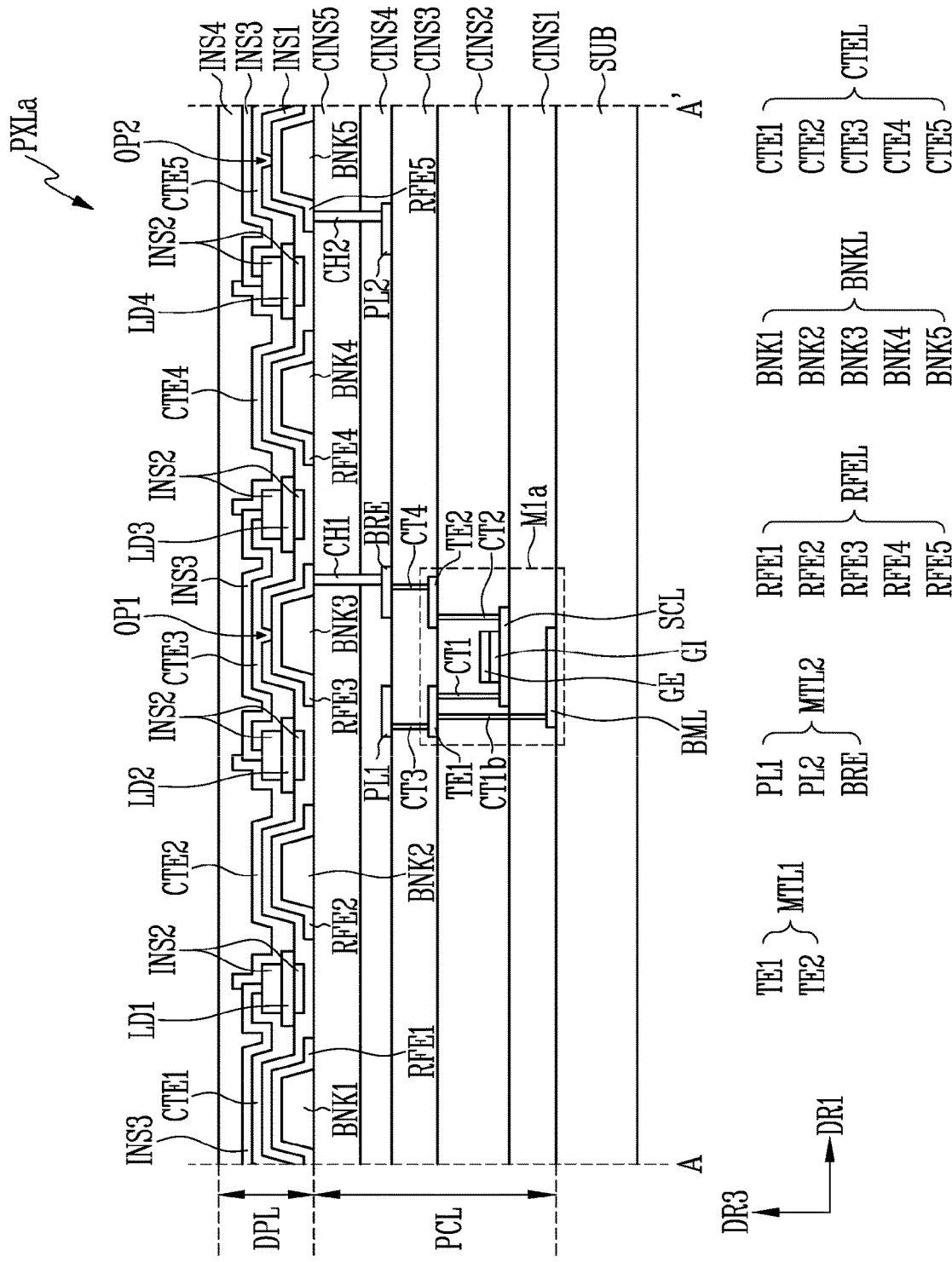
FIGS. 7A-7C are cross-sectional views of the pixel, according to some embodiments of the present disclosure.
Figure 7B:
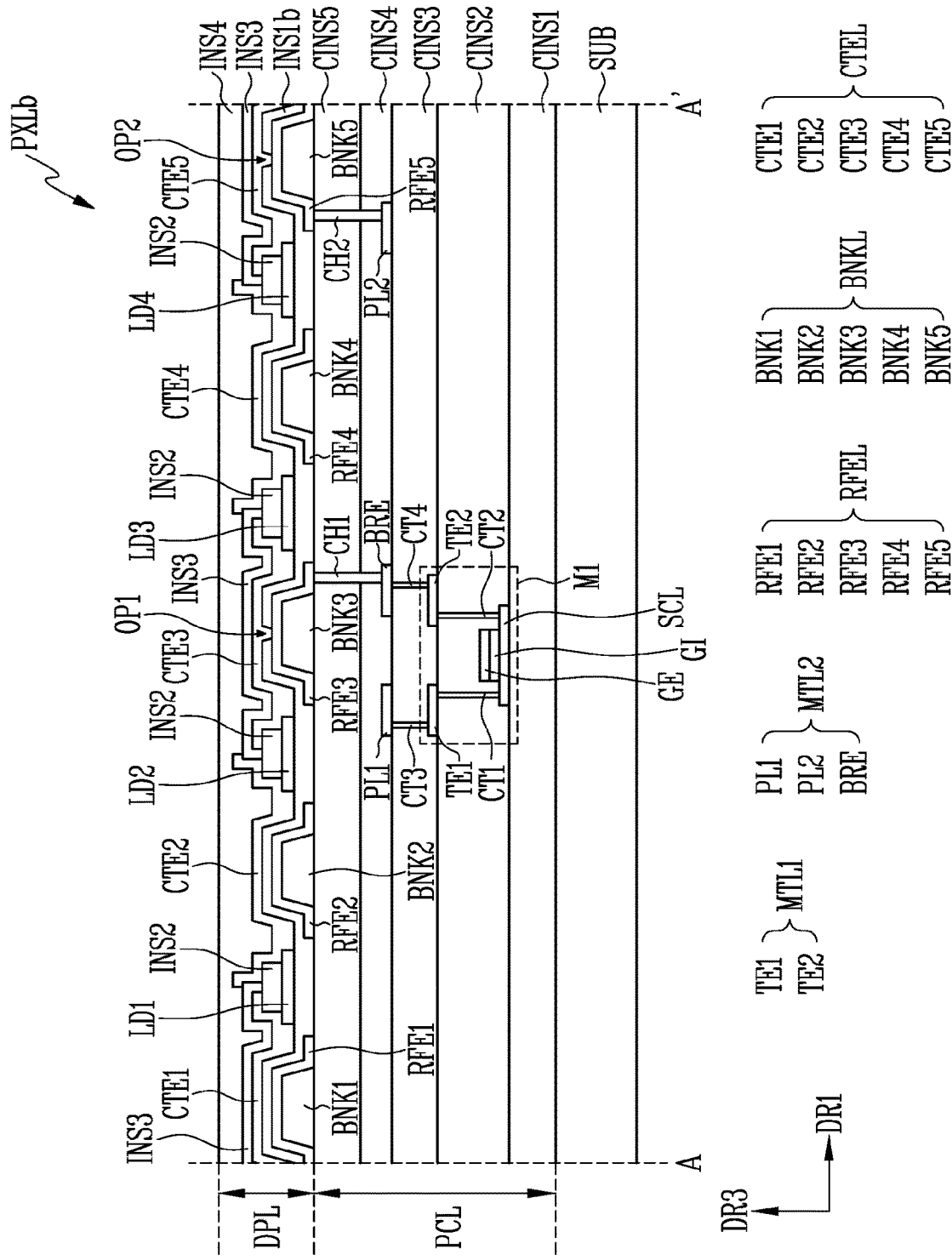
Figure 7C:
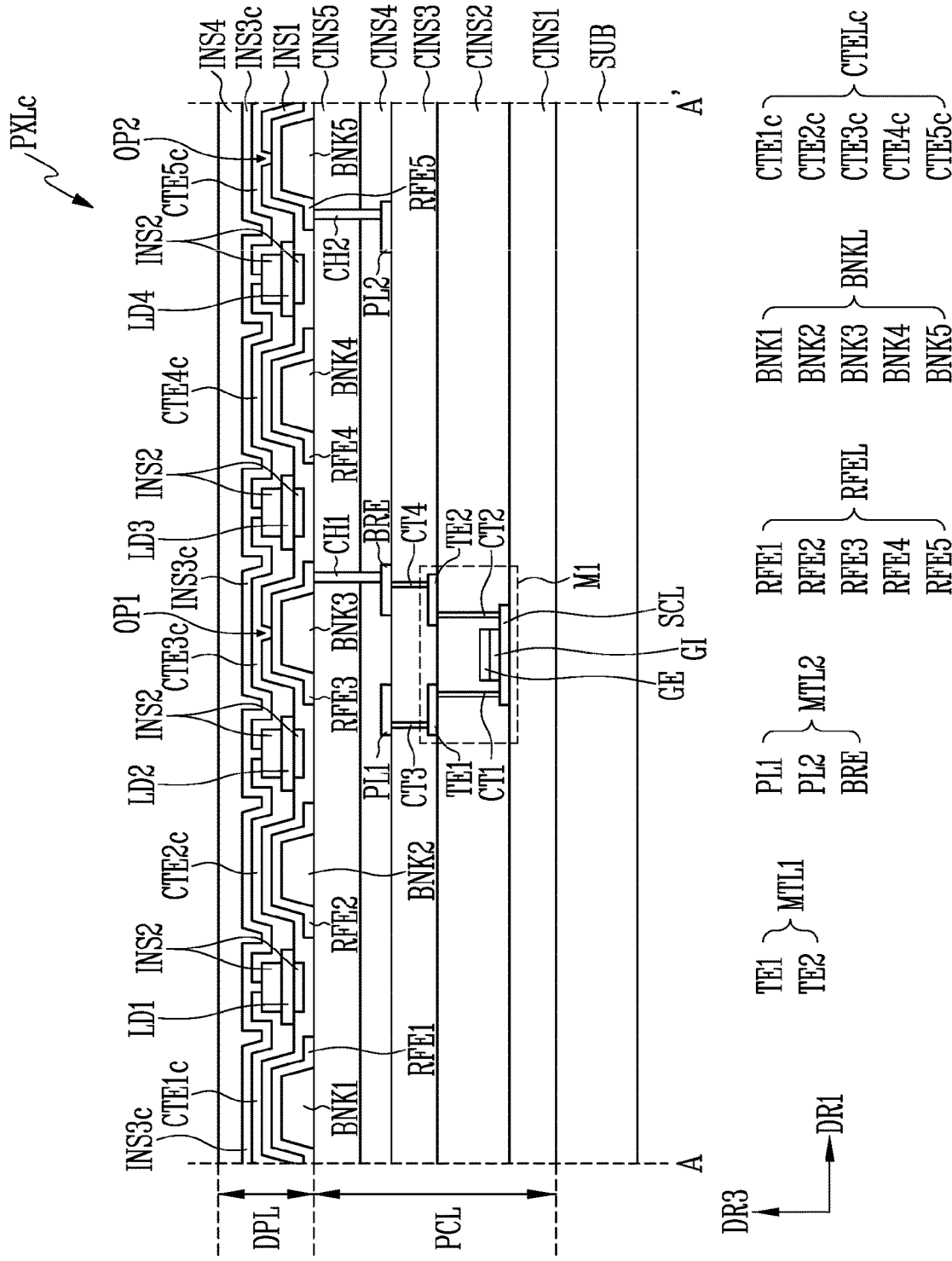
Figure 8:
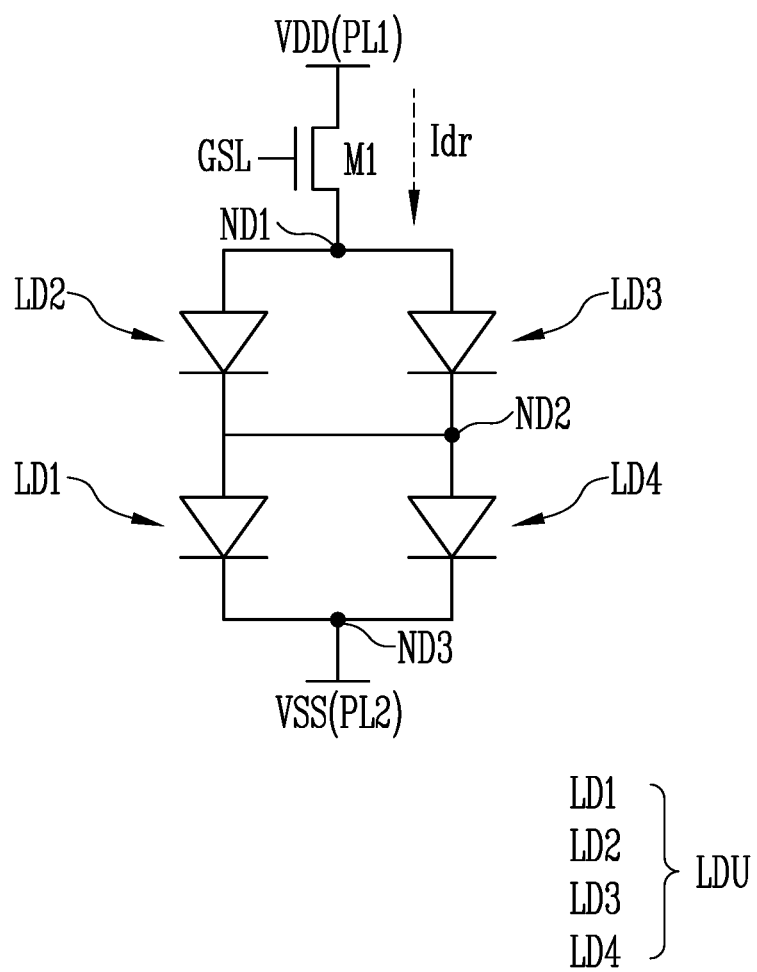
FIG. 8 is a circuit diagram schematically illustrating a connection relationship between the light emitting elements of the pixel, according to some embodiments of the present disclosure.

FIG. 5 is a plan view of the pixel, according to some embodiments of the present disclosure. FIG. 6 is a cross-sectional view of the pixel taken along the line A-A' of FIG. 5, according to some embodiments of the present disclosure. FIGS. 7A-7C are cross-sectional views of the pixel, according to some embodiments of the present disclosure. FIG. 8 is a circuit diagram schematically illustrating a connection relationship between the light emitting elements of the pixel, according to some embodiments of the present disclosure.

For convenience of description, hereinafter, each electrode is simplified as a single electrode layer, but embodiments of the present disclosure are not limited thereto. In an embodiment of the present disclosure, "formed and/or located at the same layer" may refer to being "formed in the same process and formed of the same material".

Referring to FIGS. 2, 5, and 6, the display device 1000 may include the substrate SUB and the plurality of pixels PXL located on the substrate SUB. In addition, the display device 1000 may include a pixel circuit layer PCL and a display layer DPL sequentially located on the substrate SUB. The pixel circuit layer PCL and the display layer DPL may be on the substrate SUB, and may include various components.

The substrate SUB may have a planar rectangular shape. The substrate SUB may include both short sides extending in one direction (e.g., first direction DR1) and both long sides extending in another direction (e.g., second direction DR2) crossing the one direction. A corner portion where the long side and the short side of the planar substrate SUB meet may be substantially a right angle, but is not limited thereto and may have a rounded curved shape. The planar shape of the substrate SUB is not limited to that illustrated, but may be applied in a square, a circle, an ellipse, or other shapes.

The substrate SUB may be a rigid substrate or a flexible substrate, and a material or a physical property thereof is not particularly limited. For example, the substrate SUB may be a rigid substrate configured of glass or tempered glass, or a flexible substrate configured of a thin film of a plastic or metal material. In addition, the substrate SUB may be a transparent substrate, but is not limited thereto. For example, the substrate SUB may be a translucent substrate, an opaque substrate, or a reflective substrate.

The pixel circuit layer PCL may be located on the substrate SUB. The pixel circuit layer PCL may include a plurality of circuit elements configuring the pixel driving circuit of the pixel PXL. FIG. 6 shows an example in which the pixel circuit layer PCL includes the first transistor M1 of FIG. 3A, but a structure of the pixel circuit layer PCL is not limited thereto and the pixel circuit layer PCL may further include one or more of other circuit elements of FIGS. 3A-4.

Each transistor included in the pixel circuit layer PCL may have a substantially same or similar cross-sectional structure. In addition, the structure of each transistor is not limited to the structure shown in FIG. 6.

The pixel circuit layer PCL may include a plurality of layers. For example, the pixel circuit layer PCL may include a first circuit insulating layer CINS1, a second circuit insulating layer CINS2, a third circuit insulating layer CINS3, a fourth circuit insulating layer CINS4, and a fifth circuit insulating layer CINS5 sequentially stacked on the substrate SUB. Each of the first to fifth circuit insulating layers CINS1 to CINS5 may be insulating layers including an organic insulating material or an inorganic insulating material.

The first transistor M1 may include a semiconductor pattern SCL, a gate electrode GE, a first transistor electrode TE1, and a second transistor electrode TE2.

The semiconductor pattern SCL may be located on the first circuit insulating layer CINS1. The first circuit insulating layer CINS1 may be a buffer layer that prevents an impurity from being diffused to the transistor (e.g., reduces the possibility that an impurity would be diffused to the transistor).

The semiconductor pattern SCL may include a first region that is in contact with the first transistor electrode TE1, a second region connected to the second transistor electrode TE2, and a channel region between the first and second regions. One of the first and second regions may be a source region and the other region may be a drain region.

The semiconductor pattern SCL may be a semiconductor pattern formed of polysilicon, amorphous silicon, oxide semiconductor, or the like. In addition, the channel region of the semiconductor pattern SCL may be an intrinsic semiconductor as a semiconductor pattern in which an impurity is not doped, and the first and second regions of the semiconductor pattern SCL may be semiconductor patterns in which an impurity (e.g., set or predetermined impurity) is doped, respectively.

The gate electrode GE may be on the semiconductor pattern SCL and may overlap at least a portion of the semiconductor pattern SCL. A gate insulating film GI may be located between the gate electrode GE and the semiconductor pattern SCL. The gate electrode GE and the semiconductor pattern SCL may be insulated from each other by the gate insulating film GI. In FIG. 6, a transistor of a top-gate structure in which the gate electrode GE is positioned on the semiconductor pattern SCL is illustrated, but the present disclosure is not limited thereto. For example, the gate electrode GE may be located under the semiconductor pattern SCL or may be located both on and under the semiconductor pattern SCL.

For example, as shown in FIG. 7A, a pixel PXLa may include a first transistor M1a located in the pixel circuit layer PCL. The first transistor M1a may further include a body electrode layer BML located under the semiconductor pattern SCL. The body electrode layer BML may be positioned so that at least a portion of the body electrode layer BML overlaps the semiconductor pattern SCL. The body electrode layer BML may be located between the substrate SUB and the semiconductor pattern SCL.

The body electrode layer BML may be electrically connected to the first transistor electrode TE1 through a first circuit contact hole CT1b passing through the first circuit insulating layer CINS1 and the second circuit insulating layer CINS2. The body electrode layer BML may serve to control the channel region of the semiconductor pattern SCL together with the gate electrode GE. For example, the body electrode layer BML may receive a control signal from the first transistor electrode TE1, and may be connected to the first driving power VDD of FIG. 3A through the first transistor electrode TE1. Therefore, a driving current output characteristic (for example, a saturation characteristic) of the first transistor M1a may be improved, and deterioration of the first transistor M1a may be prevented or reduced.

A first wiring layer MTL1 may be located on the second circuit insulating layer CINS2. The first wiring layer MTL1 may include a first transistor electrode TE1 and a second transistor electrode TE2. The first and second transistor electrodes TE1 and TE2 may be located at the same layer. The first and second transistor electrodes TE1 and TE2 may be electrically connected to the semiconductor pattern SCL. For example, the first and second transistor electrodes TE1 and TE2 may be in contact with the first region and the second region of the semiconductor pattern SCL through the circuit contact holes CT1 and CT2 passing through the first circuit insulating layer CINS1 and the second circuit insulating layer CINS2, respectively. For example, the first transistor electrode TE1 may be in contact with the first region of the semiconductor pattern SCL through the first circuit contact hole CT1, and the second transistor electrode TE2 may be in contact with the second region of the semiconductor pattern SCL through the second circuit contact hole CT2.

The third circuit insulating layer CINS3 may be on the first and second transistor electrodes TE1 and TE2. A second wiring layer MTL2 may be located on the third circuit insulating layer CINS3. The second wiring layer MTL2 may include a first power line PL1, a second power line PL2, and a bridge line BRE. That is, the first power line PL1, the second power line PL2, and the bridge line BRE may be located at the same layer, but the embodiments of the present disclosure are not limited thereto.

The first power line PL1 and the second power line PL2 may be lines connected to the first driving power VDD of FIG. 3A and the second driving power VSS of FIG. 3A, respectively. The first power line PL1 may be in contact with the first transistor electrode TE1 through the third circuit contact hole CT3 passing through the third circuit insulating layer CINS3. The first transistor electrode TE1 may be connected to the first power line PL1, and the first transistor M1 (or M1a) may control an amount of a driving current flowing from the first transistor electrode TE1 to a second transistor electrode TE2 in correspondence with a voltage provided to the gate electrode GE.

The bridge line BRE may be in contact with the second transistor electrode TE2 through a fourth circuit contact hole CT4 passing through the third circuit insulating layer CINS3, and may be in contact with a third electrode RFE3 through a first contact hole CH1 passing through the fourth and fifth circuit insulating layers CINS4 and CINS5. A driving current provided to the second transistor electrode TE2 may be supplied to the third electrode RFE3 through the bridge line BRE.

The second power line PL2 may be in contact with a fifth electrode RFE5 through a second contact hole CH2 passing through the fourth and fifth circuit insulating layers CINS4 and CINS5.

In FIG. 6, the first power line PL1, the second power line PL2, and the bridge line BRE are located at the same layer. However, the embodiments of the present disclosure are not limited thereto. At least one of the first power line PL1, the second power line PL2, and the bridge line BRE may be located at another layer. For example, the first power line PL1 may be located at the same layer as the gate electrode GE of the first transistor M1.

The fourth circuit insulating layer CINS4 and the fifth circuit insulating layer CINS5 may be located on the second wiring layer MTL2. The fourth circuit insulating layer CINS4 and the fifth circuit insulating layer CINS5 may include materials that are different from each other. For example, the fourth circuit insulating layer CINS4 may include an inorganic material, and the fifth circuit insulating layer CINS5 may include an organic material. When the fifth circuit insulating layer CINS5 includes an organic material, the fifth circuit insulating layer CINS5 may perform a planarization role for compensating for an upper step difference due to the configurations of the pixel circuit layer PCL, and may provide a space in which the display layer DPL located on the circuit layer PCL is located. According to an embodiment, the pixel circuit layer PCL may not include the fifth circuit insulating layer CINS5 or may further include another circuit insulating layer (e.g., an additional circuit insulating layer) located on the fifth circuit insulating layer CINS5.

The display layer DPL may be located on the pixel circuit layer PCL and may include a light emitting element unit LDU including a plurality of light emitting elements LD1, LD2, LD3, and LD4 connected in parallel and/or in series with each other.

By way of example, the display layer DPL may include a bank layer BNKL, an electrode layer RFEL, the first insulating layer INS1, the light emitting element unit LDU, the second insulating layer INS2, a contact electrode layer CTEL, the third insulating layer INS3, and the fourth insulating layer INS4 on the pixel circuit layer PCL (or the substrate SUB). According to an embodiment, the display layer DPL may further include a partition wall (not shown) located along a boundary of each pixel PXL.

The bank layer BNKL may be located in a space provided on the pixel circuit layer PCL. The bank layer BNKL may include a first bank BNK1, a second bank BNK2, a third bank BNK3, a fourth bank BNK4, and a fifth bank BNK5 arranged along the first direction DR1.

A space in which the light emitting element unit LDU is located may be provided between the banks BNK1, BNK2, BNK3, BNK4, and BNK5. In some embodiments, each of the banks BNK1, BNK2, BNK3, BNK4, and BNK5 may be spaced from each other along the first direction DR1 on the substrate SUB by a distance equal to or greater than a length of each of the light emitting elements LD1, LD2, LD3, and LD4. In addition, each of the banks BNK1, BNK2, BNK3, BNK4, and BNK5 may extend along the second direction DR2 crossing the first direction DR1 on a plane.

The bank layer BNKL may include an insulating material of an organic material or an inorganic material, but is not limited thereto.

Each of the banks BNK1, BNK2, BNK3, BNK4, and BNK5 may have a trapezoidal shape inclined at a set or predetermined angle, but a shape thereof is not limited thereto, and each of the banks BNK1, BNK2, BNK3, BNK4, and BNK5 may have various suitable shapes such as a semi-ellipse, a circle, and a quadrangle.

The electrode layer RFEL may be located on the bank layer BNKL. The electrode layer RFEL may include a first electrode RFE1, a second electrode RFE2, a third electrode RFE3, a fourth electrode RFE4, and a fifth electrode RFE5 arranged along the first direction DR1.

The electrode layers RFEL may be on the corresponding bank layers BNKL, respectively. For example, the first electrode RFE1 may be on the first bank BNK1, the second electrode RFE2 may be on the second bank BNK2, the third electrode RFE3 may be on the third bank, BNK3, the fourth electrode RFE4 may be on the fourth bank BNK4, and the fifth electrode RFE5 may be on the fifth bank BNK5.

The electrode layer RFEL may have a substantially uniform thickness along a surface of the bank layer BNKL, and the respective electrodes RFE1, RFE2, RFE3, RFE4, and RFE5 may correspond to a shape of the respective banks BNK1, BNK2, BNK3, BNK4, and BNK5. For example, the electrodes RFE1, RFE2, RFE3, RFE4, and RFE5 may have a shape substantially corresponding to an inclination degree of the respective banks BNK1, BNK2, BNK3, BNK4, and BNK5.

The respective electrodes RFE1, RFE2, RFE3, RFE4, and RFE5 of the electrode layer RFEL may be spaced apart from each other along the first direction DR1 with the corresponding light emitting element LD interposed therebetween on the substrate SUB (or the PCL) and extended along the second direction DR2.

Each of the electrodes RFE1, RFE2, RFE3, RFE4, and RFE5 may be located on the same plane and have the same height. When each of the electrodes RFE1, RFE2, RFE3, RFE4, and RFE5 has the same height, the light emitting element unit LDU may be more stably located on the electrode layer RFEL.

The electrode layer RFEL may include a conductive material. The conductive material may include silver (Ag), magnesium (Mg), aluminum (Al), platinum (Pt), palladium (Pd), gold (Au), nickel (Ni), neodymium (Nd), iridium (Ir), chromium (Cr), titanium (Ti), metal such as an alloy thereof, and the like, but is not limited thereto. In addition, the electrode layer RFEL may be a single layer, but is not limited thereto, and may have a multi-layer structure in some embodiments. For example, the electrode layer RFEL may further include a capping layer (not shown) including a transparent conductive material. The capping layer may cover the electrode layer RFEL, thereby preventing or reducing the damage to the electrode layer RFEL that may occur during a manufacturing process of the display device.

Here, the material of the electrode layer RFEL is not limited to the above-described materials. For example, the electrode layer RFEL may include a conductive material having a constant reflectance. When the electrode layer RFEL is formed of a conductive material having a constant reflectance, light emitted from both end portions of each of the light emitting elements LD1, LD2, LD3, and LD4 may be reflected by the electrode layer RFEL and may proceed to a display direction (for example, the third direction DR3).

In addition, as described above, the electrode layer RFEL may have the shape corresponding to the shape of the bank layer BNKL and may have a set or predetermined angle with respect to the substrate SUB. The light emitted from the both end portions of each of the light emitting elements LD1, LD2, LD3, and LD4 may be reflected by the electrode layer RFEL and may further proceed in the third direction DR3. Therefore, light emission efficiency of the display device may be improved.

As described above, the third electrode RFE3 may be connected to the bridge line BRE of the pixel circuit layer PCL through the first contact hole CH1 passing through the fourth circuit insulating layer CINS4 and the fifth circuit insulating layer CINS5. In addition, the fifth electrode RFE5 may be connected to the second power line PL2 of the pixel circuit layer PCL through the second contact hole CH2 passing through the fourth circuit insulating layer CINS4 and the fifth circuit insulating layer CINS5. The third electrode RFE3 may receive a driving current from the bridge line BRE, and supply the provided driving current to the light emitting element unit LDU. However, the present disclosure is not limited thereto, and the second power line PL2 and the second contact hole CH2 may overlap the first electrode RFE1. In this case, the first electrode RFE1 may be connected to the second power line PL2 through the second contact hole CH2.

The first insulating layer INS1 may be on the electrode layer RFEL. The first insulating layer INS1 may be entirely on the substrate SUB (or PCL) to cover the bank layer BNKL and the electrode layer RFEL. In addition, the first insulating layer INS1 may be located along a surface of the substrate SUB (or PCL) in which the bank layer BNKL and the electrode layer RFEL are not located.

As an embodiment, the first insulating layer INS1 may be an inorganic insulating layer including an inorganic material. In this case, the first insulating layer INS1 may have a substantially uniform thickness along the surfaces of the substrate SUB and the electrode layer RFEL, and at least some empty spaces may be formed between the first insulating layer INS1 and the light emitting elements LD1, LD2, LD3, and LD4 located on the first insulating layer INS1.

As another embodiment, as shown in FIG. 7B, a pixel PXLb may include a first insulating layer INS1b located between the substrate SUB (or PCL) and the light emitting element unit LDU. The first insulating layer INS1b may include an organic insulating film including (e.g., formed of) an organic material. In this case, the first insulating layer INS1b may fill a space between the substrate SUB (or PCL) and the light emitting element unit LDU and stably support the light emitting element unit LDU.

Meanwhile, the first insulating layer INS1 may include a first opening portion OP1 and a second opening portion OP2. The first opening portion OP1 may expose at least a portion of the third electrode RFE3, and the second opening portion OP2 may expose at least a portion of the fifth electrode RFE5.

The first and second opening portions OP1 and OP2 may overlap the third and fifth electrodes RFE3 and RFE5, respectively. For example, the first opening portion OP1 may overlap the third electrode RFE3, and the second opening portion OP2 may overlap the fifth electrode RFE5. A position of the second opening portion OP2 is not limited thereto. For example, the second opening portion OP2 may overlap the first electrode RFE1.

The first opening portion OP1 and the second opening portion OP2 may have a thickness and/or a depth corresponding to a thickness of the first insulating layer INS1. That is, the first opening portion OP1 and the second opening portion OP2 may completely pass through the first insulating layer INS1 in a corresponding region. Therefore, the third and fifth electrodes RFE3 and RFE5 may be exposed to the outside to be in contact with the third and fifth contact electrodes CTE3 and CTE5 which will be described later.

The light emitting elements LD1, LD2, LD3, and LD4 may be located on the first insulating layer INS1. Each of the light emitting elements LD1, LD2, LD3, and LD4 may be located in-between (e.g., in a space between) the banks BNK1, BNK2, BNK3, BNK4, and BNK5. For example, the first light emitting element LD1 may be located in-between (e.g., in a space between) the first bank BNK1 and the second bank BNK2, the second light emitting element LD2 may be located in-between (e.g., in a space between) the second bank BNK2 and the third banks BNK3, the third light emitting element LD3 may be located in-between (e.g., in a space between) the third bank BNK3 and the fourth bank BNK4, and the fourth light emitting element LD4 may be located in-between (e.g., in a space between) the fourth bank BNK4 and the fifth bank BNK5. The respective light emitting elements LD1, LD2, LD3, and LD4 may be connected in series and/or in parallel with each other, and may emit light of a corresponding luminance by receiving a driving current. In other words, one or more of the light emitting elements LD1, LD2, LD3, and LD4 may be connected in series and one or more of the light emitting elements LD1, LD2, LD3, and LD4 may be connected in parallel.

The second insulating layer INS2 may be located on the light emitting element unit LDU. The second insulating layer INS2 may overlap each of the light emitting elements LD1, LD2, LD3, and LD4. The second insulating layer INS2 may fill a space between each of the light emitting elements LD1, LD2, LD3, and LD4 and the first insulating layer INS1 and surround at least a portion of the light emitting elements LD1, LD2, LD3, and LD4. Therefore, the light emitting element unit LDU may be more stably located on the first insulating layer INS1 and may be fixed. The second insulating layer INS2 may cover at least a portion of each of the light emitting elements LD1, LD2, LD3, and LD4, and may expose one end portions and other end portions of each of the light emitting elements LD1, LD2, LD3, and LD4.

The contact electrode layer CTEL may be located on the first insulating layer INS1 and the second insulating layer INS2. The contact electrode layer CTEL may overlap the electrode layer RFEL. The contact electrode layer CTEL may include a first contact electrode CTE1, a second contact electrode CTE2, a third contact electrode CTE3, a fourth contact electrode CTE4, and a fifth contact electrode CTE5.

The contact electrodes CTE1, CTE2, CTE3, CTE4 and CTE5 may be in contact with end portions of the light emitting elements LD1, LD2, LD3 and LD4. For example, the first contact electrode CTE1 may be in contact with the one end portion of the first light emitting element LD1. The second contact electrode CTE2 may be in contact with the other end portion of the first light emitting element LD1 and may be in contact with the one end portion of the second light emitting element LD2. The third contact electrode CTE3 may be in contact with the other end portion of the second light emitting element LD2 and may be in contact with the one end portion of the third light emitting element LD3. The fourth contact electrode CTE4 may be in contact with the other end portion of the third light emitting element LD3 and may be in contact with the one end portion of the fourth light emitting element LD4. The fifth contact electrode CTE5 may be in contact with the end portion of the fourth light emitting element LD4.

As shown in FIG. 5, at least some of the contact electrodes CTE1, CTE2, CTE3, CTE4, and CTE5 may be connected to each other. For example, the first contact electrode CTE1 and the fifth contact electrode CTE5 may be electrically connected to each other. The first contact electrode CTE1 and the fifth contact electrode CTE5 may be connected to each other by a first connection electrode CNE1. The first contact electrode CTE1, the fifth contact electrode CTE5, and the first connection electrode CNE1 may be located at the same layer, and may be formed by the same process. In addition, the second contact electrode CTE2 and the fourth contact electrode CTE4 may be electrically connected to each other. For example, the second contact electrode CTE2 and the fourth contact electrode CTE4 may be connected to each other by a second connection electrode CNE2. The second contact electrode CTE2, the fourth contact electrode CTE4, and the second connection electrode CNE2 may be located at the same layer, and may be formed by the same process.

The contact electrode layer CTEL may include a transparent conductive material. For example, the transparent conductive material may include indium tin oxide (ITO), indium zinc oxide (IZO), indium tin-zinc oxide (ITZO), or the like. In a case where the contact electrode layer CTEL includes the transparent conductive material, when the light emitted from the light emitting elements LD1, LD2, LD3, and LD4 proceeds in the third direction DR3, loss may be reduced. The material of the contact electrode layer CTEL is not limited to the above-described materials.

As described above, the third contact electrode CTE3 may be in contact with the third electrode RFE3 through the first opening portion OP1 and receive a driving current from the third electrode RFE3. The third contact electrode CTE3 may supply the driving current to the light emitting element unit LDU. For example, the third contact electrode CTE3 may supply the driving current to the second light emitting element LD2 and the third light emitting element LD3 connected to the third contact electrode CTE3.

In addition, the fifth contact electrode CTE5 may be in contact with the fifth electrode RFE5 through the second opening portion OP2 and may receive a voltage of the second power line PL2 from the fifth electrode RFE5. That is, the fifth contact electrode CTE5 may be connected to the second driving power VSS of FIG. 3A through the second power line PL2. The fifth contact electrode CTE5 may be electrically connected to the first contact electrode CTE1 through the first connection electrode CNE1, and thus, the first contact electrode CTE1 may supply a voltage of the second driving power VSS to the first light emitting element LD1, and the fifth contact electrode CTE5 may supply the voltage of the second driving power VSS to the fourth light emitting element LD4.

The second contact electrode CTE2 may connect the first light emitting element LD1 and the second light emitting element LD2 to each other in series, and the fourth contact electrode CTE4 may connect the third light emitting element LD3 and the fourth light emitting element LD4 to each other in series. In addition, the second contact electrode CTE2 and the fourth contact electrode CTE4 may be electrically connected to each other by the second connection electrode CNE2, and thus, the first light emitting element LD1 may be connected to the fourth light emitting element LD4 in parallel, and the second light emitting element LD2 may be connected to the third light emitting element LD3 in parallel.

In this regard, a connection relationship between the light emitting elements LD1, LD2, LD3, and LD4 will be specifically described with reference to FIG. 8.

Further referring to FIG. 8, the light emitting element unit LDU may include light emitting elements LD1, LD2, LD3, and LD4 connected in series and/or in parallel with each other. In other words, one or more of the light emitting elements LD1, LD2, LD3, and LD4 may be connected in series and one or more of the light emitting elements LD1, LD2, LD3, and LD4 may be connected in parallel. The light emitting element unit LDU may be electrically connected to the first driving power VDD and the second driving power VSS to provide a driving current Idr to the light emitting elements LD1, LD2, LD3, and LD4.

A voltage provided from the first driving power VDD may be applied to the first transistor electrode TE1 of the first transistor M1 through the first power line PL1. The first transistor M1 may control the driving current Idr flowing from the first transistor electrode TE1 to the second transistor electrode TE2 in correspondence with a voltage of a gate line GSL connected to the gate electrode GE.

The driving current Idr provided by the first transistor M1 may be supplied to one side (or the first node ND1) of the light emitting element unit LDU. The first node ND1 may correspond to the third contact electrode CTE3, and the third contact electrode CTE3 may supply the driving current Idr to the second light emitting element LD2 and the third light emitting element LD3. In addition, the second node ND2 at which the second light emitting element LD2 and the third light emitting element LD3 are connected to each other may correspond to the second contact electrode CTE2 and the fourth contact electrode CTE4. That is, one side of the second light emitting element LD2 and one side of the third light emitting element LD3 are connected to each other by the third contact electrode CTE3, other electrodes of the second light emitting element LD2 and one side of the third light emitting element LD3 are connected to each other by the second contact electrode CTE2 and the fourth contact electrode CTE4, and thus the second light emitting element LD2 and the third light emitting element LD3 may be connected in parallel. The second light emitting element LD2 and the third light emitting element LD3 may emit light at a luminance corresponding to a difference between a voltage of the first node ND1 and a voltage of the second node ND2.

In some embodiments, the voltage of the second node ND2 may be less than the voltage of the first node ND1, may be greater than a voltage of the third node ND3, and may be changed according to the driving current Idr supplied to the light emitting element unit LDU. However, the embodiments of the present disclosure is not limited thereto.

As described above, the second node ND2 at which the first light emitting element LD1 and the fourth light emitting element LD4 are connected to each other may correspond to the second contact electrode CTE2 and the fourth contact electrode CTE4. The voltage supplied from the second driving power VSS may be applied to another side of the light emitting element unit LDU (for example, the third node ND3) through the second power line PL2. The first light emitting element LD1 and the fourth light emitting element LD4 may be connected to each other at the third node ND3, and the third node ND3 may correspond to the first contact electrode CTE1 and the fifth contact electrode CTE5. The first light emitting element LD1 and the fourth light emitting element LD4 may emit light at a luminance corresponding to the voltage of the second node ND2 and the voltage of the third node ND3.

The light emitting elements LD1, LD2, LD3, and LD4 of the light emitting element unit LDU may emit light at the same luminance, but are not limited thereto, and may emit light at different luminance.

Referring to FIGS. 5 and 6 again, the third insulating layer INS3 may be located between each of the contact electrodes CTE1, CTE2, CTE3, CTE4, and CTE5. Specifically, the third insulating layer INS3 may be located on the first contact electrode CTE1, the third contact electrode CTE3, and the fifth contact electrode CTE5, and at least a portion of the second contact electrode CTE2 and the fourth contact electrode CTE4 may be located on the third insulating layer INS3. That is, the first contact electrode CTE1, the third contact electrode CTE3 and the fifth contact electrode CTE5, and the second contact electrode CTE2 and the fourth contact electrode CTE4 may be located at different layers. However, the disposition of the contact electrodes CTE1, CTE2, CTE3, CTE4, and CTE5 is not limited thereto.

In some embodiments of the present disclosure, as shown in FIG. 7C, a pixel PXLc may include contact electrodes CTE1c, CTE2c, CTE3c, CTE4c, and CTE5c located at the same layer, and a third insulating layer INS3c located on the contact electrode layer CTELc. That is, the contact electrodes CTE1c, CTE2c, CTE3c, CTE4c, and CTE5c may be concurrently (or simultaneously) formed and may include the same material.

The fourth insulating layer INS4 may be located on the contact electrode layer CTEL (or the third insulating layer INS3). The fourth insulating layer INS4 may cover the contact electrode layer CTEL and may prevent or reduce damage of the contact electrode layer CTEL. In addition, the fourth insulating layer INS4 may serve as an encapsulation layer that prevents oxygen and moisture from penetrating into the light emitting elements LD1, LD2, LD3, and LD4 (or reduces the possibility that oxygen and moisture would penetrate into the light emitting elements LD1, LD2, LD3, and LD4).

The fourth insulating layer INS4 may include an inorganic insulating film including (e.g., formed of) an inorganic material or an organic insulating film including (e.g., formed of) an organic material. The fourth insulating layer INS4 may be a single layer as shown in the drawing, but is not limited thereto, and may be in some embodiments, a multilayer structure including one or more organic insulating films and one or more inorganic insulating films. For example, the fourth insulating layer INS4 may further include a planarization layer. The planarization layer may alleviate a step difference generated by various configurations located under the planarization layer. The planarization layer may include an organic insulating film, but is not limited thereto, and may include an inorganic insulating film.

As described above, the light emitting elements LD1, LD2, LD3, and LD4 of the light emitting element unit LDU may be connected in series and/or in parallel with each other. Therefore, even though a defect (e.g., a short circuit defect, a disconnection defect, or the like) occurs in some light emitting elements during an alignment and disposition process of the light emitting elements LD1, LD2, LD3, and LD4, other light emitting elements may normally operate.

For example, in a case where all of the light emitting elements are connected in parallel, when a short circuit defect occurs in some light emitting elements, all of light emitting elements of a corresponding pixel may not emit light. In addition, in a case where all of the light emitting elements are connected in series, when a disconnection defect occurs in some light emitting elements, all of light emitting elements of a corresponding pixel may not emit light.

When the light emitting elements of the light emitting element unit LDU are connected in series and/or in parallel with each other as in the disclosure, even though a short circuit defect occurs in some light emitting elements, other light emitting elements connected in series may emit light. In addition, even though a disconnection defect occurs in some light emitting elements, other light emitting elements connected in parallel may emit light. That is, the display device may secure a characteristic robust to a defect of the pixel with respect to short circuit and disconnection of some light emitting elements.

Figure 9:
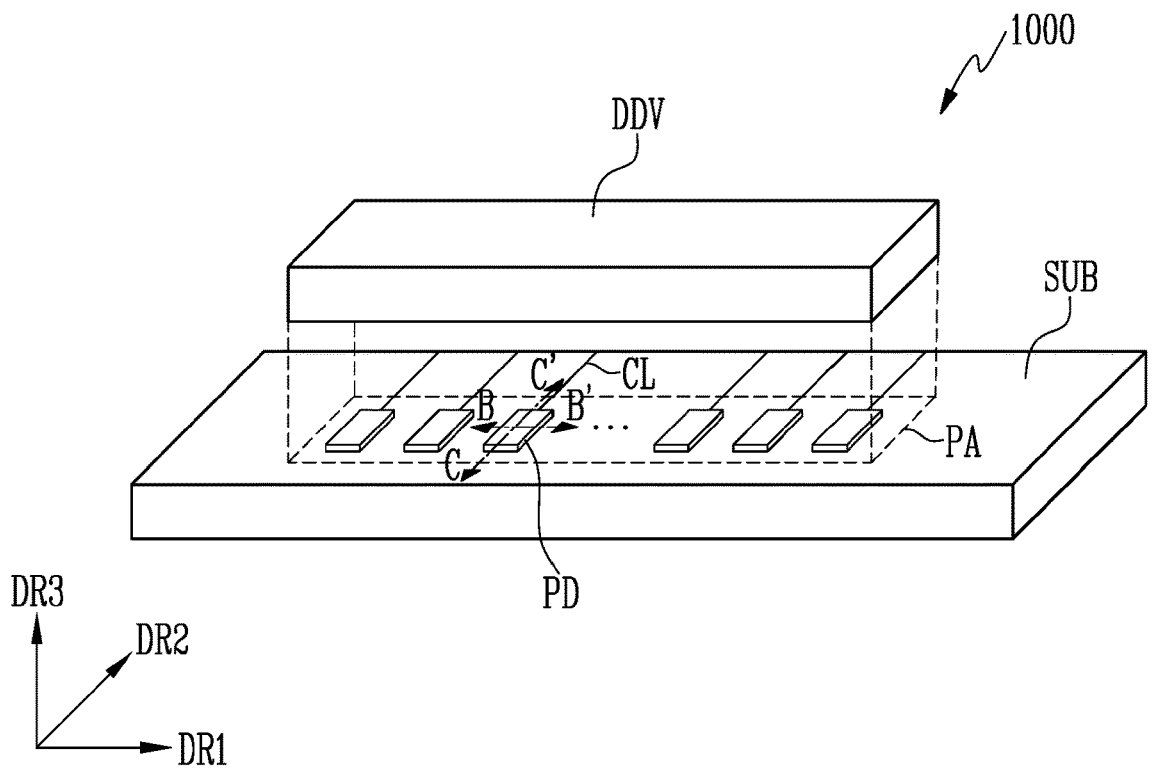
FIG. 9 is an exploded perspective view of the display device (e.g., a pixel unit of FIG. 2), according to some embodiments of the present disclosure.
Figure 10:
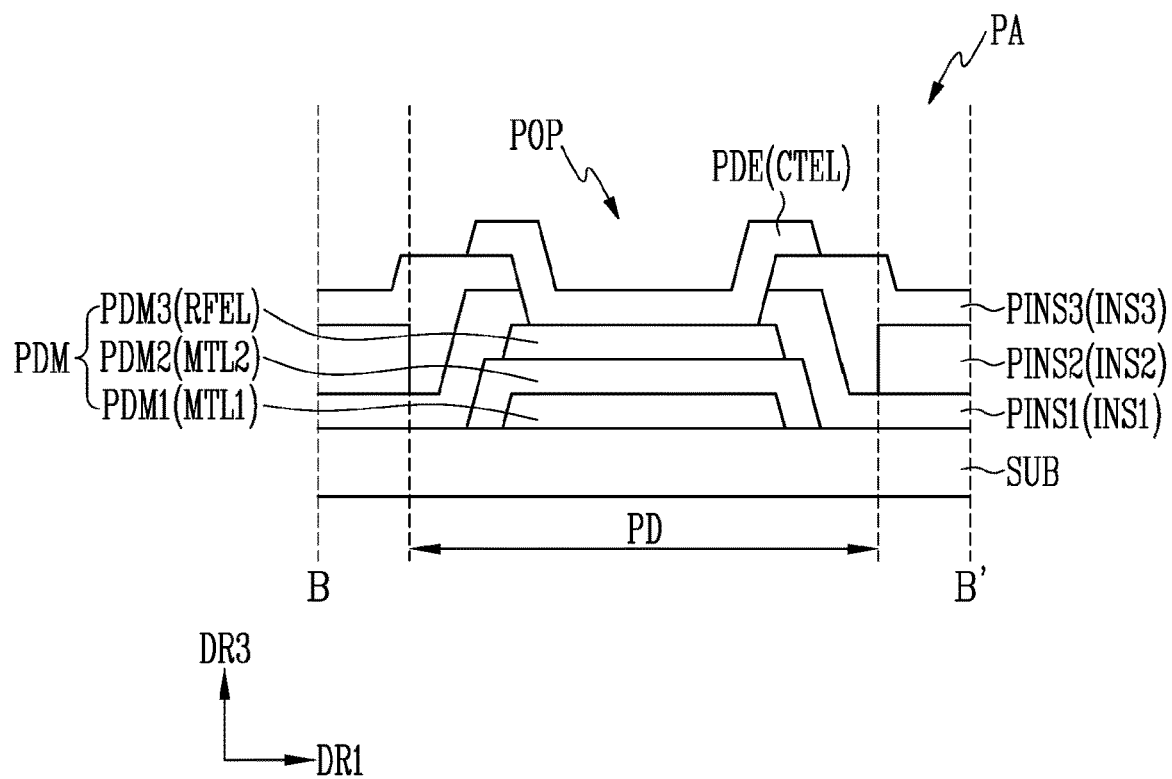
FIG. 10 is a cross-sectional view of the display device taken along the line B-B' of FIG. 9, according to some embodiments of the present disclosure.
Figure 11:
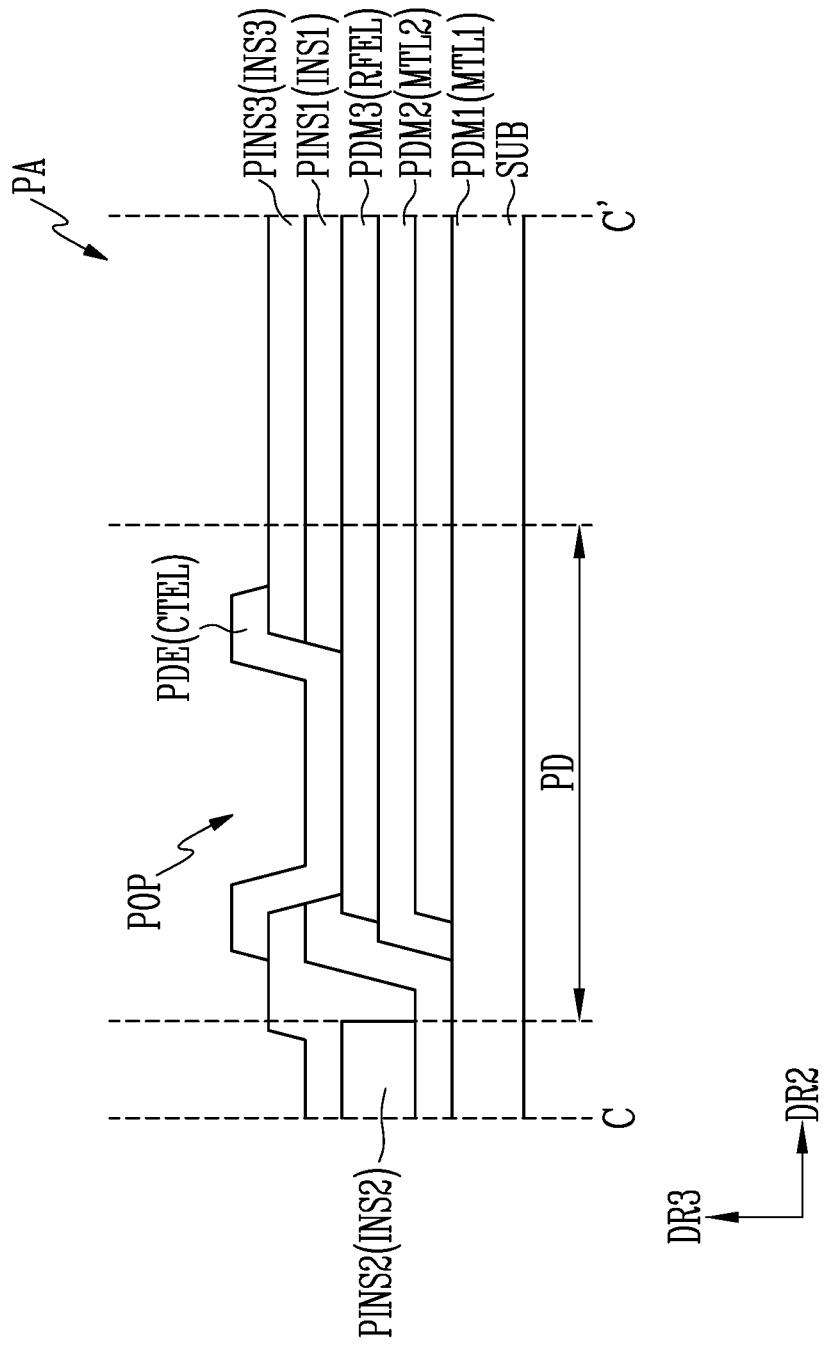
FIGS. 11 and 12 are cross-sectional views of the display device taken along the line C-C' of FIG. 10, according to some embodiments of the present disclosure.
Figure 12:
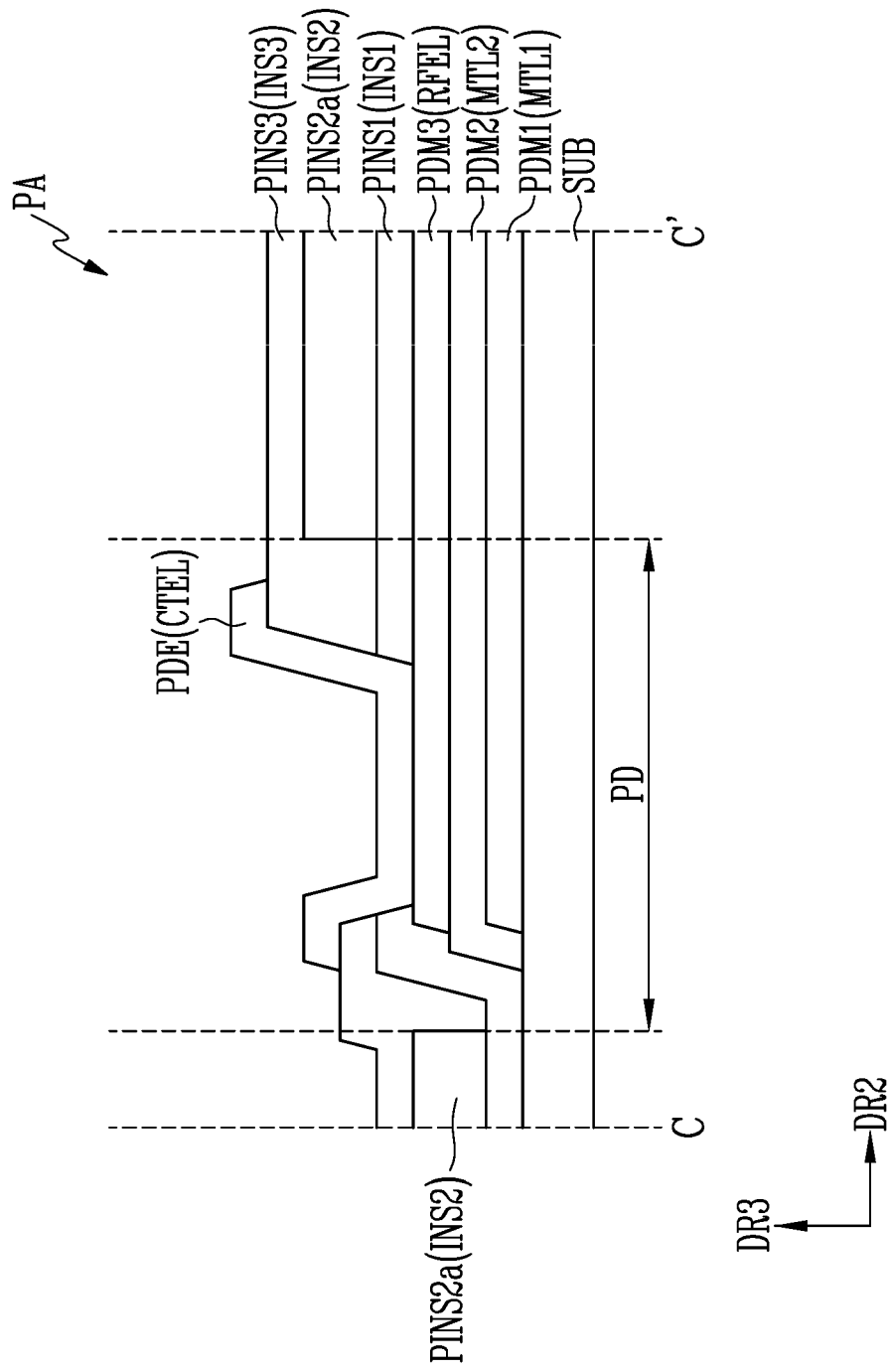

FIG. 9 is an exploded perspective view of the display device (e.g., a pixel unit of FIG. 2), according to some embodiments of the present disclosure. FIG. 10 is a cross-sectional view of the display device taken along the line B-B' of FIG. 9, according to some embodiments of the present disclosure. FIGS. 11 and 12 are cross-sectional views of the display device taken along the line C-C' of FIG. 10, according to some embodiments of the present disclosure.

Referring to FIGS. 2, 6, and 9-12, the display device 1000 may include the pad unit PA.

The pad unit PA may be located in the non-display area NDA of the substrate SUB and may be adjacent to one side of the substrate SUB on a plane. The pad unit PA may extend along one direction (for example, the first direction DR1). As described above, the data driver DDV may be located on or connected to the pad unit PA, and the data driver DDV may provide the driving signal (for example, the data signal) to the pixels PXL through the pad unit PA.

The pad unit PA may be configured of a plurality of pads PD, and the plurality of pads PD may be arranged along the first direction DR1. FIG. 9 shows a structure in which the plurality of pads PD are arranged along one column, but the present disclosure is not limited thereto, and may be arranged along a plurality of columns.

The plurality of pads PD may be connected to the connection lines CL located in the non-display area NDA, respectively. The connection lines CL may extend along the second direction DR2 and may be connected to the data lines DL located in the display area DA. That is, the pad PD may be connected to the data line DL through the connection line CL. The connection line CL and the data line DL may be formed integrally with each other, and may be located at the same layer, but the present disclosure is not limited thereto. As another embodiment, the connection line CL and the data line DL may be separately formed and/or may be located at different layers.

Each of the pads PD may include a pad metal layer PDM located on the substrate SUB, and a pad electrode PDE located on the pad metal layer PDM. In addition, the pad PD may include a plurality of pad insulating layers (e.g., PINS1, PINS2, and PINS3) covering the pad metal layer PDM.

The pad metal layer PDM may include a plurality of conductive layers, and specifically, the pad metal layer PDM may include a first metal layer PDM1, a second metal layer PDM2, and a third metal layer PDM3 sequentially located on the substrate SUB.

The pad metal layer PDM may include a conductive material. The conductive material may include silver (Ag), magnesium (Mg), aluminum (Al), platinum (Pt), palladium (Pd), gold (Au), nickel (Ni), neodymium (Nd), iridium (Ir), chromium (Cr), titanium (Ti), a metal such as an alloy thereof, and the like, but is not limited thereto.

The conductive materials included in each of the metal layers PDM1, PDM2, and PDM3 may be different from each other. However, in some embodiments, some of the metal layers PDM1, PDM2, and PDM3 or all of the metal layers PDM1, PDM2, and PDM3 may include the same conductive material.

The first metal layer PDM1 may have a trapezoidal shape in which a side surface thereof is inclined at a set or predetermined angle, but is not limited thereto, and may have various shapes such as a semi-ellipse, a circle, and a quadrangle.

The first metal layer PDM1 may be located at the same layer as the first wiring layer MTL1 of the pixel circuit layer PCL and may be formed concurrently (or simultaneously) with the first wiring layer MTL1. That is, the first metal layer PDM1 may be located at the same layer as the first transistor electrode TE1 and the second transistor electrode TE2 of the first transistor M1.

The second metal layer PDM2 may be on the first metal layer PDM1. The second metal layer PDM2 may be located along a surface of the first metal layer PDM1 and may cover an upper surface and a side surface of the first metal layer PDM1, but is not limited thereto. In addition, the second metal layer PDM2 may have the same thickness as the first metal layer PDM1, but in some embodiments, may have a thickness different from that of the first metal layer PDM1.

The second metal layer PDM2 may be located at the same layer as the second wiring layer MTL2 of the pixel circuit layer PCL and may be formed concurrently (or simultaneously) with the second wiring layer MTL2. That is, the second metal layer PDM2 may be located at the same layer as the first power line PL1, the second power line PL2, and the bridge line BRE.

The third metal layer PDM3 may be on the second metal layer PDM2. The third metal layer PDM3 may be located on a portion of an upper surface of the second metal layer PDM2. That is, the third metal layer PDM3 may not cover a side surface of the second metal layer PDM2, but the present disclosure is not limited thereto.

The third metal layer PDM3 may be located at the same layer as the electrode layer RFEL of the display layer DPL and may be formed concurrently (or simultaneously) with the electrode layer RFEL.

In some embodiments, a portion of the pad metal layer PDM may extend along the second direction DR2 and may be connected to the connection line CL. In some embodiments, the pad metal layer PDM may be formed integrally with the connection line CL.

The pad unit PA may include a first pad insulating layer PINS1, a second pad insulating layer PINS2, and a third pad insulating layer PINS3 located on the pad metal layer PDM.

The first pad insulating layer PINS1 may be formed along a surface of the pad metal layer PDM and may cover the entire pad metal layer PDM. The first pad insulating layer PINS1 may include a pad opening portion POP that exposes at least a portion of the third metal layer PDM3.

The first pad insulating layer PINS1 may be located at the same layer as the first insulating layer INS1 of the display layer DPL, and may be formed concurrently (or simultaneously) with the first insulating layer INS1. In addition, the first pad insulating layer PINS1 may be formed integrally with the first insulating layer INS1. That is, the first pad insulating layer PINS1 (or the first insulating layer INS1) may be entirely formed on the substrate SUB and may be located at (or on) both of the display area DA and the non-display area NDA.

The second pad insulating layer PINS2 may be located on the first pad insulating layer PINS1.

The second pad insulating layer PINS2 may not overlap the pad PD. For example, the second pad insulating layer PINS2 may not overlap the pad metal layer PDM and the pad electrode PDE.

The second pad insulating layer PINS2 may be formed by entirely forming an insulating material layer on the first pad insulating layer PINS1 and then removing a portion overlapping the pad PD, but the present disclosure is not limited thereto.

The second pad insulating layer PINS2 may be located at the same layer as the second insulating layer INS2 of the display layer DPL, and may be formed concurrently (or simultaneously) with the second insulating layer INS2. In addition, the second pad insulating layer PINS2 may be formed integrally with the second insulating layer INS2. That is, the second pad insulating layer PINS2 (or the second insulating layer INS2) may be entirely formed on the substrate SUB and may be located at both of the display area DA and the non-display area NDA.

The disposition of the second pad insulating layer PINS2 is not limited thereto, and the second pad insulating layer PINS2 may be arranged in more various ways. For example, as shown in FIG. 12, at least a portion of a second pad insulating layer PINS2a may overlap the first metal layer PDM1, the second metal layer PDM2, and the third metal layer PDM3 along the second direction DR2. However, even in this case, the second pad insulating layer PINS2a may not overlap the pad electrode PDE.

The third pad insulating layer PINS3 may be located on the first pad insulating layer PINS1 and the second pad insulating layer PINS2.

The third pad insulating layer PINS3 may be entirely formed along surfaces of the first pad insulating layer PINS1 and the second pad insulating layer PINS2. The third pad insulating layer PINS3 may include the pad opening portion POP that exposes at least a portion of the third metal layer PDM3. That is, the first pad insulating layer PINS1 and the third pad insulating layer PINS3 may expose the third metal layer PDM3 by including the pad opening portions POP common to each other.

As an embodiment, the pad opening portion POP may be concurrently (or simultaneously) formed in the first pad insulating layer PINS1 and the third pad insulating layer PINS3 by sequentially forming a first insulating material layer (for example, the first pad insulating layer PINS1 before forming the pad opening portion POP), the second pad insulating layer PINS2, and a third insulating material layer (for example, the third pad insulating layer PINS3 before forming the pad opening portion POP) on the pad metal layer PDM, and then removing the first insulating material layer and the second insulating material layer to expose the third metal layer PDM3, but the present disclosure is not limited thereto. As another embodiment, the pad opening portion POP may be formed separately in the first pad insulating layer PINS1 and the third pad insulating layer PINS3.

The pad electrode PDE may be located on the pad metal layer PDM. The pad electrode PDE may be located in an area exposed by the pad opening portion POP of the first pad insulating layer PINS1 and the third pad insulating layer PINS3. Therefore, the pad electrode PDE may be electrically connected to the pad metal layer PDM, and may for example be in contact with the third metal layer PDM3. The pad electrode PDE may connected to the data driver DDV located on or connected to the pad unit PA. An anisotropic conductive film (ACF) may be located between the pad electrode PDE and the data driver DDV, and the pad PD and the data driver DDV may be electrically connected to each other through the ACF (not shown).

As described above, the second pad insulating layer PINS2 may be located so as not to overlap the pad metal layer PDM. When the second pad insulating layer PINS2 does not overlap the pad metal layer PDM, a step difference due to the pad opening portion POP between the pad metal layer PDM and the insulating layers (for example, the first pad insulating layer PINS1 and the second pad insulating layer PINS2) covering the pad metal layer PDM may be reduced. Therefore, in a process of forming the pad electrode PDE on the pad metal layer PDM, a defect (for example, a contact defect or the like) that may occur between the pad metal layer PDM and the pad electrode PDE due to the step difference may be improved, and bonding reliability of the pad electrode PDE and the data driver DDV may be improved.

In embodiments of the present disclosure, the pad unit PA located between the substrate SUB and the data driver DDV has been described. However, the pad unit PA may also be applied to a case where other drivers are further located on or connected to the substrate SUB through the pad unit.

Hereinafter, the pixel and the display device including the same according to other embodiments will be described. In the following embodiment, the same configuration as the previously described embodiments will be referred to by the same reference numerals, the description thereof will be omitted or simplified, and a difference will be mainly described.

Figure 13:
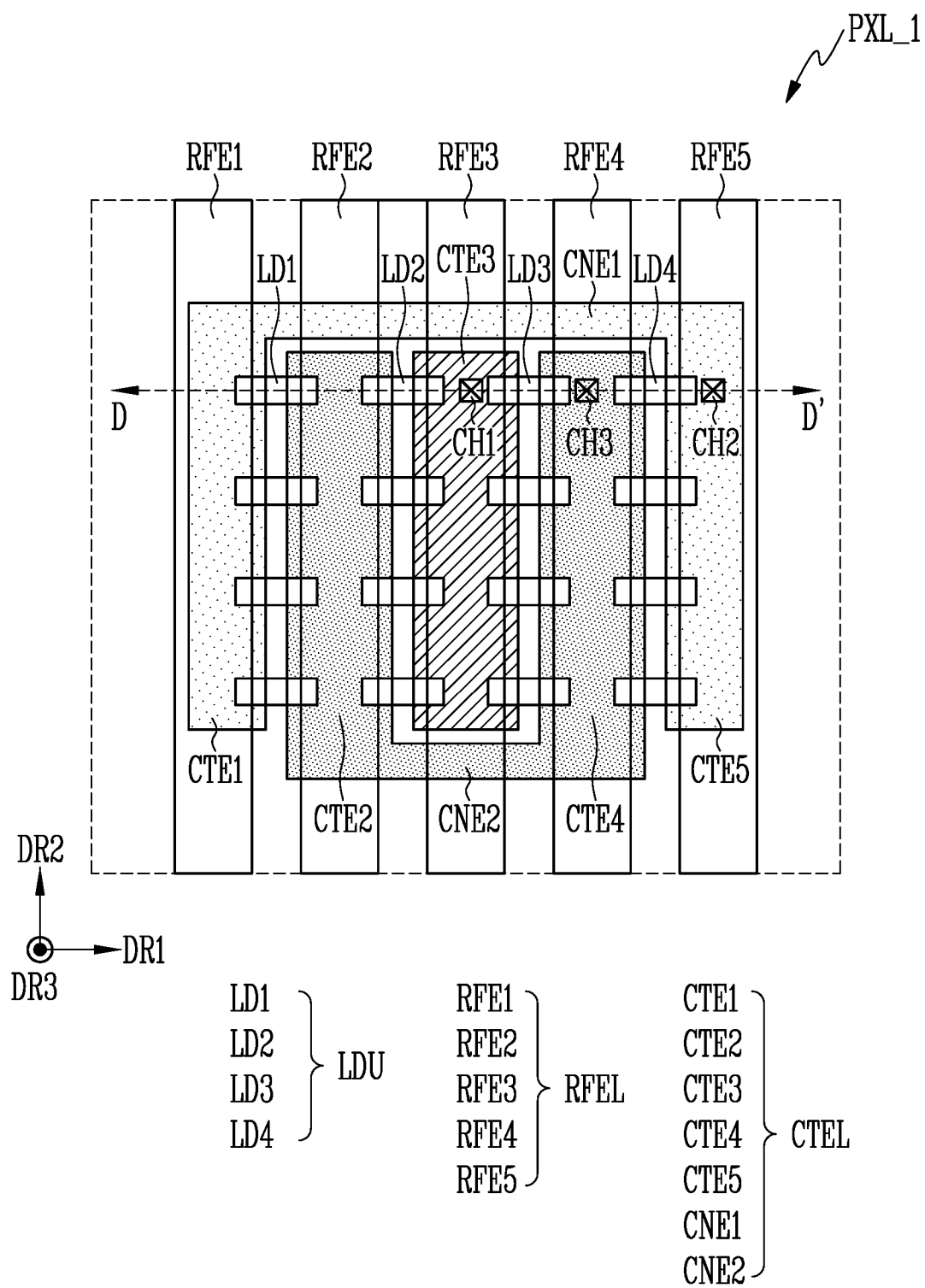
FIG. 13 is a plan view of the pixel according to some embodiments of the present disclosure.
Figure 14:
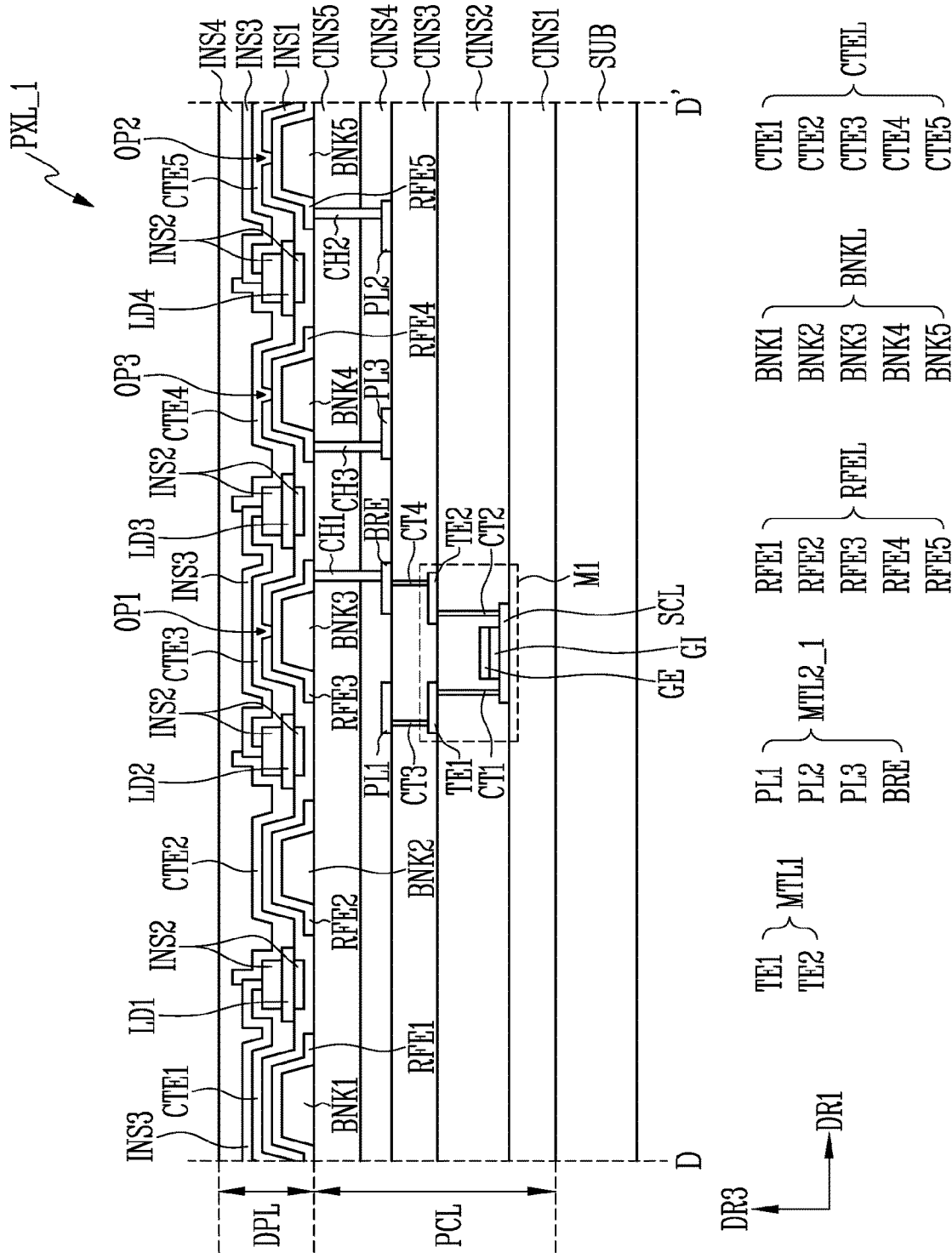
FIG. 14 is a cross-sectional view of the pixel taken along the line D-D' of FIG. 13, according to some embodiments of the present disclosure.
Figure 15:
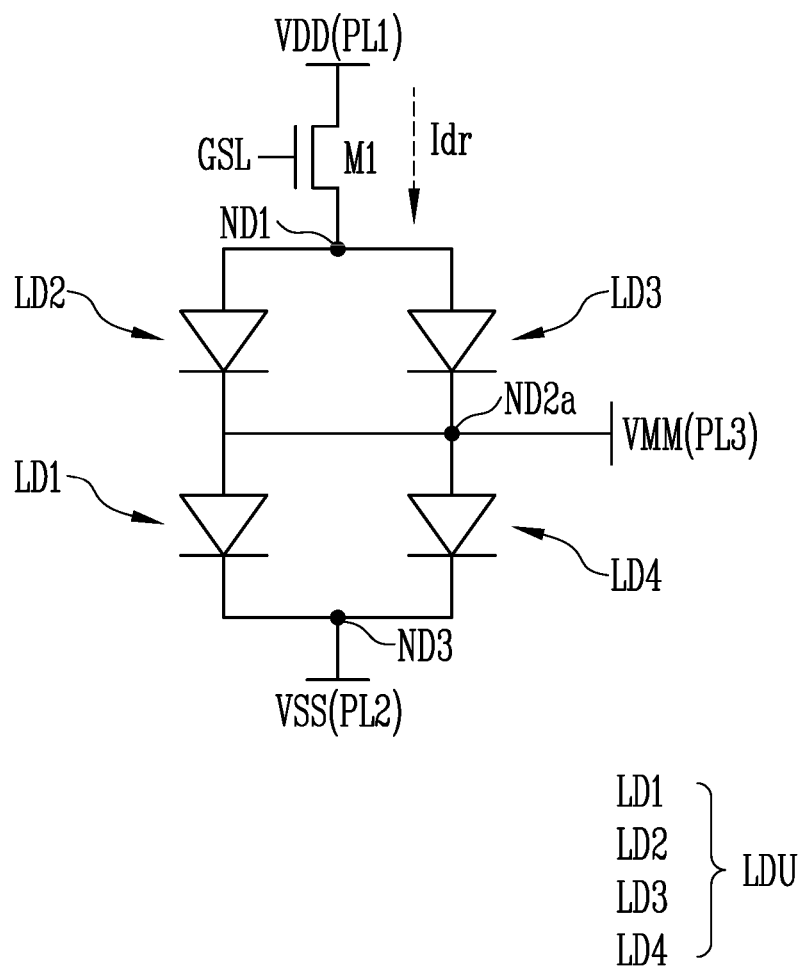
FIG. 15 is a circuit diagram schematically illustrating the connection relationship between the light emitting elements of the pixel, according to some embodiments of the present disclosure.

FIG. 13 is a plan view of the pixel, according to some embodiments of the present disclosure. FIG. 14 is a cross-sectional view of the pixel taken along the line D-D' of FIG. 13. according to some embodiments of the present disclosure. FIG. 15 is a circuit diagram schematically illustrating the connection relationship between the light emitting elements of the pixel, according to some embodiments of the present disclosure.

The embodiment of FIGS. 13-15 has a difference in that the fourth electrode RFE4 is connected to a third power line PL3 as compared with the embodiments of FIGS. 5, 6, and 8, and other configurations are substantially the same or similar to those of the embodiment of FIGS. 5, 6, and 8. Hereinafter, the difference will be mainly described.

The pixel PXL_1 may include the pixel circuit layer PCL and the display layer DPL located on the substrate SUB. The pixel circuit layer PCL may include a second wiring layer MTL2_1, and the second wiring layer MTL2_1 may include the first power line PL1, the second power line PL2, the third power line PL3, and the bridge line BRE.

The third power line PL3 may be a line connected to third driving power VMM, and may receive a set or predetermined voltage from the third driving power VMM. The third power line PL3 may be in contact with the fourth electrode RFE4 through a third contact hole CH3 passing through the fourth and fifth circuit insulating layers CINS4 and CINS5.

The first insulating layer INS1 may include a third opening portion OP3 overlapping the fourth electrode RFE4, and the fourth contact electrode CTE4 may be in contact with the fourth electrode RFE4 through the third opening portion OP3. The fourth contact electrode CTE4 may receive a voltage of the third driving power VMM from the fourth electrode RFE4.

The fourth contact electrode CTE4 and the second contact electrode CTE2 may be connected to each other through the second connection electrode CNE2, and the same voltage may be applied to the second contact electrode CTE2 and the fourth contact electrode CTE4.

As shown in FIG. 15, the light emitting elements LD1, LD2, LD3, and LD4 may be connected in series and/or in parallel with each other, and may be connected to each other at a second node ND2a. The voltage of the third driving power VMM may be supplied to the second node ND2a. For example, a voltage of the second node ND2a may be an average value of a voltage of the first node ND1 and a voltage of the third node ND3, but is not limited thereto. The voltage of the second node ND2a may be a specific voltage between the voltage of the first node ND1 and the voltage of the third node ND3.

Therefore, the second light emitting element LD2 and the third light emitting element LD3 may emit light at a luminance corresponding to a difference between the voltage of the first node ND1 and the voltage of the second node ND2a, and the first light emitting element LD1 and the fourth light emitting element LD4 may emit light at a luminance corresponding to the voltage of the second node ND2a and the voltage of the third node ND3.

Although some the embodiments of the present disclosure have been described with reference to the accompanying drawings, it will be understood by those skilled in the art to which the disclosure pertains that the embodiments may be implemented in other specific forms without changing the technical spirit and essential features of the disclosure. Therefore, it should be understood that the embodiments described above are illustrative and are not restrictive in all aspects.

What is claimed is:

1. A display device comprising:
   a substrate including a display area and a non-display area;
   a pixel located in the display area;
   a pad unit located on one side of the non-display area; and
   a driver connected to the pixel through the pad unit,
   wherein the pad unit comprises:
   a pad metal layer;
   a first pad insulating layer on the pad metal layer, and comprising a first pad opening portion exposing at least a portion of the pad metal layer;
   a second pad insulating layer on the first pad insulating layer, and comprising a second pad opening portion entirely overlapping the pad metal layer; and
   a pad electrode on the first pad insulating layer, and being in contact with the pad metal layer through the first pad opening portion and the second pad opening portion.

2. The display device according to claim 1, further comprising:

a transistor located between the substrate and the pixel, the transistor comprising:
- a semiconductor pattern on the substrate;
- a gate electrode on the semiconductor pattern; and
- a first transistor electrode and a second transistor electrode on the gate electrode,
- wherein the semiconductor pattern comprises a first region being in contact with the first transistor electrode, a second region spaced from the first region and being in contact with the second transistor electrode, and a channel region between the first region and the second region, and
- wherein the first transistor electrode is electrically connected to a first power line located at a layer different from a layer at which the first transistor electrode is located.

3. The display device according to claim 2, wherein the pad metal layer comprises at least one of a first metal layer, a second metal layer on the first metal layer, and a third metal layer on the second metal layer,
- wherein the first metal layer is located at a same layer as the first transistor electrode and the second transistor electrode,
- wherein the second metal layer is located at a same layer as the first power line, and
- wherein the third metal layer is located at a same layer as an electrode of the pixel.

4. The display device according to claim 1, wherein the pixel further comprises:
- an electrode;
- a first insulating layer on the electrode;
- a first light emitting element on the first insulating layer; and
- a second insulating layer on the first light emitting element.

5. The display device according to claim 4,
- wherein the first pad insulating layer is located at a same layer as the first insulating layer, and
- wherein the second pad insulating layer is located at a same layer as the second insulating layer.

6. The display device according to claim 4,
- wherein the pad unit further comprises a third pad insulating layer on the pad metal layer and the second pad insulating layer, and
- wherein the third pad insulating layer comprises a third pad opening portion exposing at least a portion of the pad metal layer.

7. The display device according to claim 6, wherein at least a portion of the pad electrode overlaps the first pad insulating layer and the third pad insulating layer, and the pad electrode does not overlap the second pad insulating layer.

8. The display device according to claim 6, wherein the pixel further comprises:
- a first contact electrode on the second insulating layer, and connected to one end portion of the first light emitting element; and
- a second contact electrode on the second insulating layer, and connected to another end portion of the first light emitting element.

9. The display device according to claim 8,
- wherein the pixel further comprises a third insulating layer on the first contact electrode,
- wherein the second contact electrode is on the third insulating layer, and
- wherein the third insulating layer located at a same layer as the third pad insulating layer.

10. The display device according to claim 8, wherein the pad electrode is located at a same layer as the first contact electrode or the second contact electrode.

11. A display device comprising:
- a substrate including a display area and a non-display area;
- a pixel located in the display area;
- a pad unit located on one side of the non-display area; and
- a driver connected to the pixel through the pad unit,
- wherein the pad unit comprises:
- a first metal layer on the substrate;
- a second metal layer on the first metal layer;
- a third metal layer on the second metal layer;
- a pad insulating layer on the third metal layer, and comprising a pad opening portion exposing at least a portion of the third metal layer; and
- a pad electrode on the pad insulating layer, and being in contact with the third metal layer through the pad opening portion.

12. The display device according to claim 11, further comprising:
- a transistor located between the substrate and the pixel, the transistor comprising:
- a semiconductor pattern on the substrate;
- a gate electrode on the semiconductor pattern; and
- a first transistor electrode and a second transistor electrode on the gate electrode,
- wherein the semiconductor pattern comprises a first region being in contact with the first transistor electrode, a second region spaced from the first region and being in contact with the second transistor electrode, and a channel region between the first region and the second region, and
- wherein the first transistor electrode is electrically connected to a first power line located at a layer different from a layer at which the first transistor electrode is located.

13. The display device according to claim 12, wherein the first metal layer is located at a same layer as the first transistor electrode and the second transistor electrode,
- wherein the second metal layer is located at a same layer as the first power line, and
- wherein the third metal layer is located at a same layer as an electrode of the pixel.

14. The display device according to claim 11, wherein the pixel further comprises:
- an electrode;
- a first insulating layer on the electrode;
- a first light emitting element on the first insulating layer; and
- a second insulating layer on the first light emitting element.

15. The display device according to claim 14, wherein the pixel further comprises:
- a first contact electrode on the second insulating layer, and connected to one end portion of the first light emitting element; and
- a second contact electrode on the second insulating layer, and connected to another end portion of the first light emitting element.

16. The display device according to claim 15,
- wherein the pixel further comprises a third insulating layer on the first contact electrode, and
- wherein the second contact electrode is on the third insulating layer.

17. The display device according to claim 15, wherein the pad electrode is located at a same layer as the first contact electrode or the second contact electrode.

* * * * *